US012731985B2

(12) United States Patent
Kim

(10) Patent No.: US 12,731,985 B2
(45) Date of Patent: Sep. 8, 2026

(54) POWER CLAMP CIRCUIT AND ELECTRONIC DEVICE INCLUDING POWER CLAMP CIRCUIT

(71) Applicant: SK hynix Inc., Icheon-si (KR)

(72) Inventor: Gyu Nam Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 219 days.

(21) Appl. No.: 18/623,509

(22) Filed: Apr. 1, 2024

(65) Prior Publication Data

US 2025/0096559 A1 Mar. 20, 2025

Related U.S. Application Data

(63) Continuation-in-part of application No. 18/607,098, filed on Mar. 15, 2024.

(30) Foreign Application Priority Data

Sep. 19, 2023 (KR) ........................ 10-2023-0125145

(51) Int. Cl.
*H02H 9/04* (2006.01)
*H03K 17/687* (2006.01)

(52) U.S. Cl.
CPC ......... *H02H 9/046* (2013.01); *H03K 17/6871* (2013.01)

(58) Field of Classification Search
CPC ........................... H02H 9/046; H03K 17/6871
USPC ............................................................ 361/56
See application file for complete search history.

(56) References Cited

U.S. PATENT DOCUMENTS 6,459,553 B1 * 10/2002 Drapkin ................. H02H 9/046 257/355
6,621,679 B1 * 9/2003 Segervall ............. H10D 89/819 361/111
7,529,070 B2 * 5/2009 Bhattacharya ....... H10D 89/811 361/111

(Continued)

FOREIGN PATENT DOCUMENTS

CN 106410773 A * 2/2017 ............. H02H 9/047
CN 107425514 A * 12/2017 ............. H02H 9/045

(Continued)

OTHER PUBLICATIONS

Li, Xiao-yun; Title: Enhanced type stacked ESD circuit and mixed-voltage input and output interface circuit; Date: Feb. 15, 2017; Entire specification and drawings. (Year: 2015).*

*Primary Examiner* — Dharti H Patel

(57) ABSTRACT

A power clamp circuit includes an electro-static discharge (ESD) current discharge circuit including a first MOS transistor, a second MOS transistor, and a third MOS transistor that are coupled in series between a first power rail coupled to a supply voltage and a second power rail coupled to a ground voltage, a first triggering circuit including a first resistor, a first capacitor, and a fourth MOS transistor and configured to trigger the first MOS transistor, a second triggering circuit including a second resistor, a second capacitor, and a fifth MOS transistor and configured to trigger the second MOS transistor, and a third triggering circuit including a third resistor and a third capacitor, and configured to turn off the third MOS transistor during a normal operation and turn on the third MOS transistor when an ESD event occurs.

19 Claims, 9 Drawing Sheets

(56) References Cited

U.S. PATENT DOCUMENTS

| | | | | |
|---|---|---|---|---|
| 7,742,265 | B2 * | 6/2010 | Rice | H10D 89/811 361/56 |
| 7,782,580 | B2 * | 8/2010 | Gauthier, Jr. | H10D 89/819 361/111 |
| 8,643,988 | B1 * | 2/2014 | Kwong | H02H 9/046 361/118 |
| 9,013,843 | B2 * | 4/2015 | Chen | H02H 9/046 361/118 |
| 10,930,639 | B2 * | 2/2021 | Meng | H10D 89/601 |
| 12,100,946 | B2 * | 9/2024 | Zhu | H10D 89/811 |
| 12,401,189 | B2 * | 8/2025 | Lee | H02H 9/045 |
| 12,451,687 | B2 * | 10/2025 | Chu | H10D 89/601 |
| 2006/0203405 | A1 * | 9/2006 | Bhattacharya | H10D 89/811 361/91.1 |
| 2006/0274466 | A1 * | 12/2006 | Rice | H10D 89/811 361/56 |
| 2007/0177317 | A1 | 8/2007 | Kim | |
| 2009/0086391 | A1 * | 4/2009 | Gauthier, Jr. | H10D 89/819 361/56 |
| 2013/0229736 | A1 * | 9/2013 | Van Der Borght | H02H 9/044 361/56 |
| 2014/0063665 | A1 * | 3/2014 | Chen | H02H 9/041 361/56 |
| 2018/0351352 | A1 * | 12/2018 | Chen | H10D 89/819 |
| 2019/0190256 | A1 * | 6/2019 | Agarwal | H02H 9/046 |
| 2023/0170689 | A1 * | 6/2023 | Zhu | H10D 89/921 361/56 |
| 2024/0136813 | A1 * | 4/2024 | Kim | H02H 9/046 |
| 2025/0125611 | A1 * | 4/2025 | Chu | H02H 9/046 |
| 2026/0018882 | A1 * | 1/2026 | Stockinger | H02H 9/045 |

FOREIGN PATENT DOCUMENTS

| | | | | | |
|---|---|---|---|---|---|
| CN | 207184049 | U | * | 4/2018 | |
| CN | 106410773 | B | * | 9/2018 | H02H 9/047 |
| CN | 110460030 | B | * | 7/2022 | H02H 9/042 |
| KR | 20170044357 | A | | 4/2017 | |
| TW | 202505837 | A | * | 2/2025 | H10D 89/931 |

* cited by examiner

Figure 1:
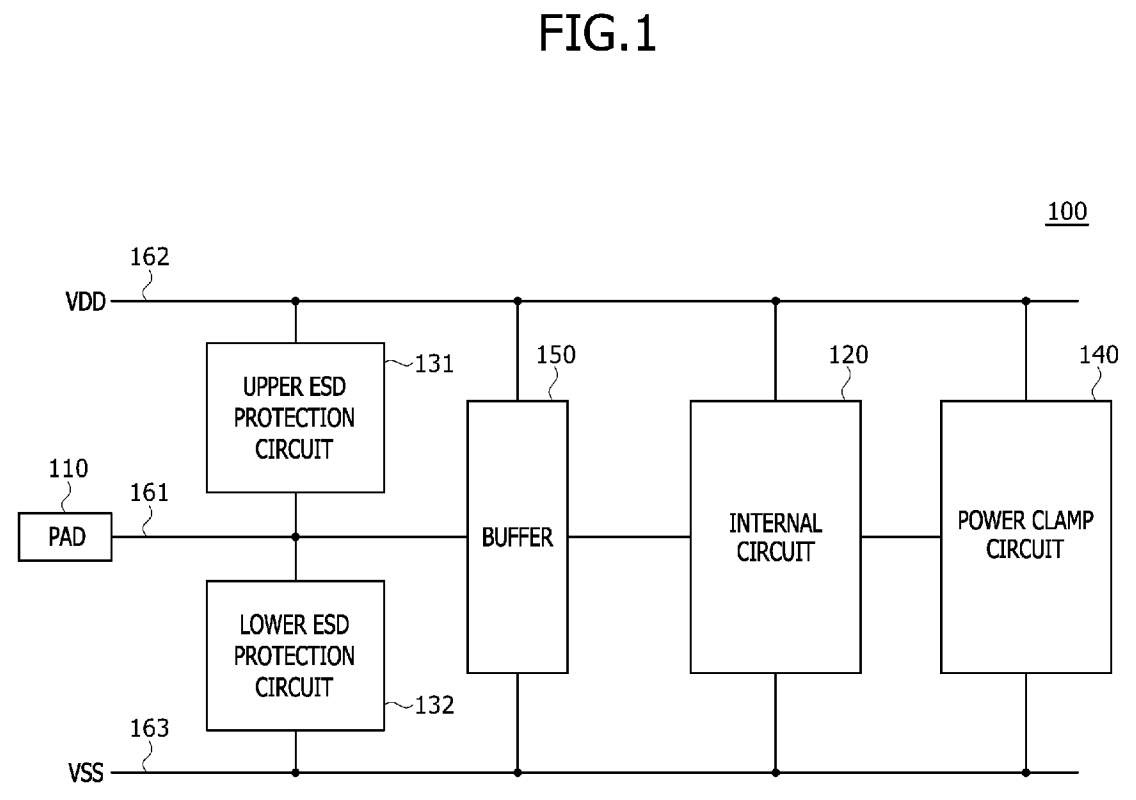

VDD 162

PAD 110

161

VSS 163

UPPER ESD PROTECTION CIRCUIT 131

LOWER ESD PROTECTION CIRCUIT 132

BUFFER 150

INTERNAL CIRCUIT 120

POWER CLAMP CIRCUIT 140

200
210
240
NM1
NM2
NM3
VG1
VG2
VG3
241
242
243
222
223
221
PM4
NM11
VCCQ
NM9
NM8
PM3
N3
V_DIV
NM5
VN3
R3
NM4
PM2
V_DIV
N2
R2
NM10
C2
PM1
N1
R1
NM6
NM7
VG2
C1
VDD
231
VSS
232

200
210
240
NM1(ON)
NM2(ON)
NM3(OFF)
VG1
=2.16V
VG2
=1.2V
VG3
=0V
241
242
243
221
222
223
VCCQ=1.2V
NM9(ON)
PM4(OFF)
NM11(ON)
NM8(ON)
PM3(ON)
N3
VN3=1.2V
V_DIV
=2.16V
NM5(ON)
NM4(ON)
PM2(OFF)
R3
N2
R2
VN2
=2.16V
(ON)NM10
C2(OPENED)
PM1(OFF)
N1
R1
VN1
= 3.3V
(ON)NM6
(ON)NM7
C1(OPENED)
VDD
VDD
=3.3V
231
VSS
232

FIG.5

400
410
440
NM1
NM2
NM3
VG1
VG2
VG3
441
442
443
422
423
421
V_DIV1
V_DIV2
NM4
NM5
NM6
NM7
NM8
NM9
NM10
NM11
PM1
PM2
PM3
R1
R2
R3
N1
N2
N3
C1
C2
C3
VDD
VSS
431
432

POWER CLAMP CIRCUIT AND ELECTRONIC DEVICE INCLUDING POWER CLAMP CIRCUIT

CROSS-REFERENCE TO RELATED APPLICATIONS

The present application is a continuation-in-part of pending U.S. patent application Ser. No. 18/607,098, filed on Mar. 15, 2024, which claims priority under 35 U.S.C. 119 (a) to Korean Application No. 10-2023-0125145, filed on Sep. 19, 2023, which is herein incorporated by references in its entirety.

BACKGROUND

1. Technical Field

Embodiments of the present disclosure generally relate to a power clamp circuit and an electronic device including the power clamp circuit.

2. Related Art

Power clamp circuits are widely used in the semiconductor industry as an on-chip solution to protect main circuits or devices under test (DUT) from electro-static discharge (ESD). Static electricity accumulates for a number of reasons, including mishandling of mechanical equipment and transfer of electrical charges from the human body. When electrical charges are not diverted, permanent failure of the core integrated circuit or DUT can result. The power clamp circuit may include a plurality of MOS transistors. Due to trends in lowering the operating voltage of the MOS transistors constituting the power clamp circuit, steps should be taken to ensure the reliability of the MOS transistors to prevent damage when an ESD event occurs as well as during normal operation.

SUMMARY

A power clamp circuit according to an embodiment of the present disclosure may include an electro-static discharge (ESD) current discharge circuit including a first MOS transistor, a second MOS transistor, and a third MOS transistor that are coupled in series between a first power rail coupled to a supply voltage and a second power rail coupled to a ground voltage, a first triggering circuit including a first resistor, a first capacitor, and a fourth MOS transistor and configured to trigger the first MOS transistor, a second triggering circuit including a second resistor, a second capacitor, and a fifth MOS transistor and configured to trigger the second MOS transistor, and a third triggering circuit including a third resistor and a third capacitor, and configured to turn off the third MOS transistor during a normal operation and to turn on the third MOS transistor when an ESD event occurs.

An electronic device according to an embodiment of the present disclosure may include a pad, an internal circuit coupled to the pad, a first power rail through which a supply voltage is provided, and a second power rail through which a ground voltage is provided, and a power clamp circuit configured to protect the internal circuit when an electro-static discharge (ESD) event occurs. The power clamp circuit may include an ESD current discharge circuit including a first MOS transistor, a second MOS transistor, and a third MOS transistor that are coupled in series between the first power rail and the second power rail, a first triggering circuit including a first resistor, a first capacitor, and a fourth MOS transistor and configured to trigger the first MOS transistor, a second triggering circuit including a second resistor, a second capacitor, and a fifth MOS transistor and configured to trigger the second MOS transistor, and a third triggering circuit including a third resistor and a third capacitor, and configured to turn off the third MOS transistor during a normal operation and to turn on the third MOS transistor when the ESD event occurs.

BRIEF DESCRIPTION OF THE DRAWINGS

FIG. 1 is a block diagram illustrating an electronic device including a power clamp circuit according to an embodiment of the present disclosure.

FIG. 5 is a circuit diagram illustrating an example of an electro-static discharge protection operation of a power clamp circuit of FIG. 2 according to an embodiment of the present disclosure.

DETAILED DESCRIPTION

Figure 2:
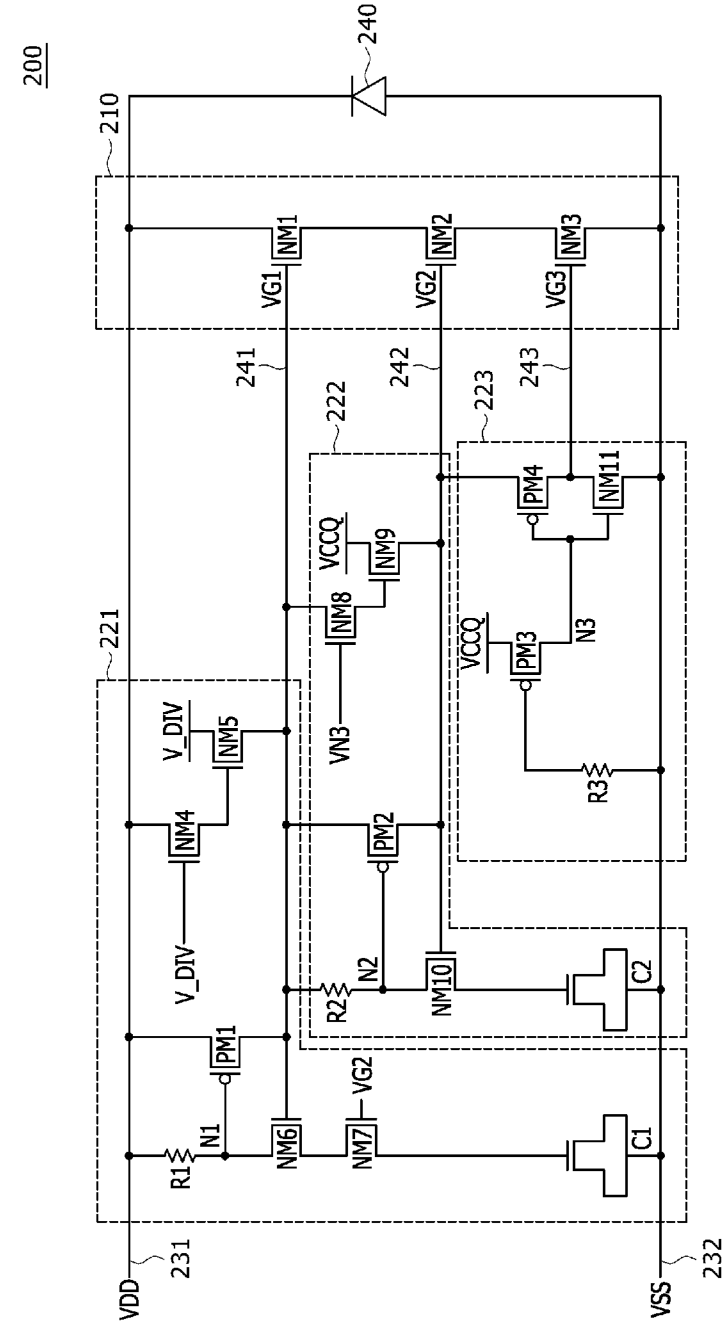
FIG. 2 is a circuit diagram illustrating a power clamp circuit according to an embodiment of the present disclosure.

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean relative positional relationship, but not used to limit certain cases for which the element directly contacts the other element, or at least one intervening element is present between the two elements. Accordingly, the terms such as "on," "over," "above," "under," "beneath," "below," and the like that are used herein are for the purpose of describing particular embodiments only and are not intended to limit the scope of the present disclosure.

Further, when an element is referred to as being "connected" or "coupled" to another element, the element may be electrically or mechanically connected or coupled to the other element directly, or may be electrically or mechanically connected or coupled to the other element indirectly with one or more additional elements between the two elements. Moreover, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is executed.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage may correspond to a signal having a logic "low" level. In an embodiment, the logic "high" level may be set as a voltage level that is higher than a voltage level of the logic "low" level. Logic levels of signals may be set to be different or opposite according to embodiment. For example, a certain signal having a logic "high" level in one embodiment may be set to have a logic "low" level in another embodiment.

Various embodiments of the present disclosure will be described hereinafter in detail with reference to the accompanying drawings. However, embodiments described herein are for illustrative purposes only and are not intended to limit the scope of the present disclosure.

FIG. 1 is a block diagram illustrating an electronic device including a power clamp circuit according to an embodiment of the present disclosure.

Referring to FIG. 1, an electronic device 100 may include a pad 110, an internal circuit 120, an upper ESD protection circuit 131, a lower ESD protection circuit 132, and a power clamp circuit 140. The electronic device 100 may further include a buffer 150. The pad 110 may allow the electronic device 100 to be electrically coupled to an external circuit, such as one or more other integrated circuits. That is, the electronic device 100 may receive signals from the external circuit through the pad 110 or may transmit signals to the external circuit through the pad 110. The pad 110 may be coupled to the upper ESD protection circuit 131, the lower ESD protection circuit 132, and the buffer 150 through a first voltage line 161.

The internal circuit 120 may perform various types of operations and functions, and may include a number of logic devices and circuits, analog devices and circuits, and other types of devices and circuits to perform the various types of operations and functions. The internal circuit 120 may include transistors, diodes, pre-amplifiers, operational amplifiers, buffers, inverters, and/or other circuits. In addition, the internal circuit 120 may include a level-shifter adapted to convert a voltage signal in a certain range into a voltage signal in another range, and the internal circuit 120 may include a signal amplification circuit. The internal circuit 120 may include volatile memory cells such as DRAM cells or non-volatile memory cells such as NAND cells or NOR cells.

The internal circuit 120 may be coupled to a second voltage line 162 through which a supply voltage VDD is applied and a third voltage line 163 through which a ground voltage VSS is applied. The internal circuit 120 may be electrically coupled to the buffer 150. In an embodiment, the buffer 150 may include a pull-up driver and a pull-down driver as input and output circuits. As the buffer 150 is coupled to the pad 110 through the first voltage line 161, the signal transmitted from the outside through the pad 110 may be transmitted to the internal circuit 120 through the first voltage line 161 and the buffer 150. The signal output from the internal circuit 120 may be transmitted to the outside through the buffer 150, the first voltage line 161, and the pad 110.

The upper ESD protection circuit 131 may be coupled to the first voltage line 161 and the second voltage line 162. The lower ESD protection circuit 132 may be coupled to the first voltage line 161 and the third voltage line 163. When an ESD event occurs in which ESD current flows into the pad 110, the ESD current may be discharged to the second voltage line 162 through the upper ESD protection circuit 131, or may be discharged to the third voltage line 163 through the lower ESD protection circuit 132.

The power clamp circuit 140 may be coupled to the second voltage line 162 and the third voltage line 163. When the electronic device 100 operates normally, a current movement path from the second voltage line 162 to the third voltage line 163 within the power clamp circuit 140 may be blocked. On the other hand, when an ESD event occurs in the electronic device 100, the power clamp circuit 140 may include an ESD current discharge circuit. A current movement path from the second voltage line 162 to the third voltage line 163 may be formed within the power clamp circuit 140. In an embodiment, when an ESD voltage is applied to the pad 110, the ESD current may flow into the power clamp circuit 140 through the upper ESD protection circuit 131 and the second voltage line 162. In this case, the power clamp circuit 140 may allow the ESD current flowing into the power clamp circuit 140 through the second voltage line 162 to be discharged to the third voltage line 163 through the ESD current discharge circuit of the power clamp circuit 140.

FIG. 2 is a circuit diagram illustrating a power clamp circuit according to an embodiment of the present disclosure. A power clamp circuit 200 may be utilized as a power clamp circuit 140 included in an electronic device 100 described above with reference to FIG. 1.

Referring to FIG. 2, the power clamp circuit 200 may include an ESD current discharge circuit 210, a first triggering circuit 221, a second triggering circuit 222, and a third triggering circuit 223. Like the power clamp circuit (140 in FIG. 1) described with reference to FIG. 1, the power clamp circuit 200 may protect an internal circuit (120 in FIG. 1) from an ESD surge (or an ESD current) when an ESD event occurs. The power clamp circuit 200 may include a diode 240. The diode 240 may be disposed between a first power rail 231 and a second power rail 232. In an embodiment, the first power rail 231 and the second power rail 232 may be lines through which a supply voltage VDD and a ground voltage VSS are provided, respectively, and may correspond to the second voltage line (162 in FIG. 1) and the third voltage line (163 in FIG. 1) described with reference to FIG. 1, respectively. A cathode and an anode of the diode 240 may be coupled to the first power rail 231 and the second power rail 232, respectively. The diode 240 may provide an ESD current path from the second power rail 232 to the first power rail 231 when a negative ESD event occurs.

The ESD current discharge circuit 210 may include a first MOS transistor NM1, a second MOS transistor NM2, and a third MOS transistor NM3, which are disposed in series between the first power rail 231 and the second power rail 232. Each of the first MOS transistor NM1, the second MOS transistor NM2, and the third MOS transistor NM3 may be an N-channel type MOS (hereinafter, "NMOS") transistor. In embodiments disclosed herein, the first MOS transistor NM1, the second MOS transistor NM2, and the third MOS transistor NM3 may be referred to as a first NMOS transistor NM1, a second NMOS transistor NM2, and a third NMOS transistor NM3, respectively, and each of the first NMOS transistor NM1, the second NMOS transistor NM2, and the third NMOS transistor NM3 may be implemented using a big MOSFET.

A gate of the first NMOS transistor NM1 may be coupled to a first gate line 241. Accordingly, the first NMOS transistor NM1 may be turned on or turned off depending on a first gate voltage VG1 applied to the first gate line 241. A drain of the first NMOS transistor NM1 may be coupled to the first power rail 231. A source of the first NMOS transistor NM1 may be coupled to a drain of the second NMOS transistor NM2. A gate of the second NMOS transistor NM2 may be coupled to a second gate line 242. Accordingly, the second NMOS transistor NM2 may be turned on or turned off depending on a second gate voltage VG2 applied to the second gate line 242. A source of the second NMOS transistor NM2 may be coupled to a drain of the third NMOS transistor NM3. A gate of the third NMOS transistor NM3 may be coupled to a third gate line 223. Accordingly, the third NMOS transistor NM3 may be turned on or turned off depending on a third gate voltage VG3 applied to the third gate line 223. A source of the third NMOS transistor NM3 may be coupled to the second power rail 232.

The first triggering circuit 221 may include a first resistor R1, a first capacitor C1, and a fourth MOS transistor PM1. The first capacitor C1 may be a MOS capacitor. The fourth MOS transistor PM1 may be a P-channel type MOS (hereinafter, "PMOS") transistor. In embodiments disclosed herein, the fourth MOS transistor PM1 may be referred to as a first PMOS transistor PM1. The second triggering circuit 222 may include a second resistor R2, a second capacitor C2, and a fifth MOS transistor PM2. The second capacitor C2 may be a MOS capacitor. The fifth MOS transistor PM2 may be a PMOS transistor. In embodiments disclosed herein, the fifth MOS transistor PM2 may be referred to as a second PMOS transistor PM2. A resistance of the first resistor R1, a capacitance of the first capacitor C1, a resistance of the second resistor R2, and a capacitance of the second capacitor C2 may be set so that a first RC delay value, obtained by multiplying the resistance of the first resistor R1 and the capacitance of the first capacitor C1, and a second RC delay value, obtained by multiplying the resistance of the second resistor R2 and the capacitance of the second capacitor C2, are the same.

The first triggering circuit 221 may include a sixth MOS transistor NM4, a seventh MOS transistor NM5, an eighth MOS transistor NM6, and a ninth MOS transistor NM7. Each of the sixth MOS transistor NM4, the seventh MOS transistor NM5, the eighth MOS transistor NM6, and the ninth MOS transistor NM7 may be an NMOS transistor. Hereinafter, the sixth MOS transistor NM4, the seventh MOS transistor NM5, the eighth MOS transistor NM6, and the ninth MOS transistor NM7 may be referred to respectively as a fourth NMOS transistor NM4, a fifth NMOS transistor NM5, a sixth NMOS transistor NM6, and a seventh NMOS transistor NM7.

The second triggering circuit 222 may include a tenth MOS transistor NM8, an eleventh MOS transistor NM9, and a twelfth MOS transistor NM10. Each of the tenth MOS transistor NM8, the eleventh MOS transistor NM9, and the twelfth MOS transistor NM10 may be an NMOS transistor. Hereinafter, the tenth MOS transistor NM8, the eleventh MOS transistor NM9, and the twelfth MOS transistor NM10 may be referred to respectively as an eighth NMOS transistor NM8, a ninth NMOS transistor NM9, and a tenth NMOS transistor NM10.

The third triggering circuit 223 may include a third resistor R3, a thirteenth MOS transistor PM3, a fourteenth MOS transistor PM4, and a fifteenth MOS transistor NM11. Each of the thirteenth MOS transistor PM3 and the fourteenth MOS transistor PM4 may be a PMOS transistor. The fifteenth MOS transistor NM11 may be an NMOS transistor. Hereinafter, the thirteenth MOS transistor PM3, the fourteenth MOS transistor PM4, and the fifteenth MOS transistor NM11 may be referred to respectively as a third PMOS transistor PM3, a fourth PMOS transistor PM4, and an eleventh NMOS transistor NM11.

In more detail, the first resistor R1 of the first triggering circuit 221 may be disposed between the first power rail 231 and a first node N1. A gate of the first PMOS transistor PM1 may be coupled to the first node N1. A source of the first PMOS transistor PM1 may be coupled to the first power rail 231. A drain of the first PMOS transistor PM1 may be coupled to the first gate line 241. A gate of the fourth NMOS transistor NM4 may be coupled to a branch voltage V_DIV. Although not shown in FIG. 2, the branch voltage V_DIV may be generated by a voltage branch circuit. The voltage branch circuit will be described in more detail with reference to FIG. 3 below. A drain of the fourth NMOS transistor NM4 may be coupled to the first power rail 231. A source of the fourth NMOS transistor NM4 may be coupled to a gate of the fifth NMOS transistor NM5. A drain of the fifth NMOS transistor NM5 may be coupled to the branch voltage V_DIV. A source of the fifth NMOS transistor NM5 may be coupled to the first gate line 241. In an embodiment, the fourth NMOS transistor NM4 and the fifth NMOS transistor NM5 may be pass transistors that transfer the voltage applied to the gate to source outputs.

A gate of the sixth NMOS transistor NM6 may be coupled to the first gate line 241. A drain of the sixth NMOS transistor NM6 may be coupled to the first node N1. A source of the sixth NMOS transistor NM6 may be couped to a drain of the seventh NMOS transistor NM7. A gate of the seventh NMOS transistor NM7 may be coupled to the second gate line 242. Accordingly, the same second gate voltage VG2 applied to the gate of the second NMOS transistor NM2 may be applied to the gate of the seventh NMOS transistor NM7. A source of the seventh NMOS transistor NM7 may be coupled to the first capacitor C1. When the first capacitor C1 is a MOS capacitor, the source of the seventh NMOS transistor NM7 may be coupled to a gate of the MOS capacitor.

The second resistor R2 of the second triggering circuit 222 may be disposed between the first gate line 241 and a second node N2. A gate of the second PMOS transistor PM2 may be coupled to the second node N2. A source of the second PMOS transistor PM2 may be coupled to the first gate line 241. A drain of the second PMOS transistor PM2 may be coupled to the second gate line 242. A gate of the eighth NMOS transistor NM8 may be coupled to a voltage at a third node N3, that is, a third node voltage VN3. The third node N3 may be a node coupled to a drain of the third PMOS transistor PM3 of the third triggering circuit 223. A drain of the eighth NMOS transistor NM8 may be coupled to the first gate line 241. A source of the eighth NMOS transistor NM8 may be coupled to a gate of the ninth NMOS transistor NM9. A drain of the ninth NMOS transistor NM9 may be coupled to an external power supply voltage VCCQ, and thus, may receive the external power supply voltage VCCQ. The external power supply voltage VCCQ may have a magnitude less than the supply voltage VDD. A source of the ninth NMOS transistor NM9 may be coupled to the second gate line 242. In an embodiment, the eighth NMOS transistor NM8 and the ninth NMOS transistor NM9 may be pass transistors that transfer the voltage applied to the gate to the source output. A gate of the tenth NMOS transistor NM10 may be coupled to the second gate line 242. A drain of the tenth NMOS transistor NM10 may be coupled to the second node N2. A source of the tenth NMOS transistor NM10 may be coupled to the second capacitor C2. When the second capacitor C2 is a MOS capacitor, the source of the tenth NMOS transistor NM10 may be coupled to the gate of the MOS capacitor.

The third resistor R3 of the third triggering circuit 223 may be disposed between a gate of the third PMOS transistor PM3 and the second power rail 232. A source of the third PMOS transistor PM3 may be coupled to the external power supply voltage VCCQ, and thus, may receive the external power supply voltage VCCQ. A drain of the third PMOS transistor PM3 may be coupled to the third node N3. The fourth PMOS transistor PM4 and the eleventh NMOS transistor NM11 may constitute an inverter circuit. That is, a gate of the fourth PMOS transistor PM4 and a gate of the eleventh NMOS transistor NM11 may be commonly coupled to the third node N3. A drain of the fourth PMOS transistor PM4 and a drain of the eleventh NMOS transistor NM11 may be commonly coupled to a third gate line 243. A source of the fourth PMOS transistor PM4 may be coupled to the second gate line 242. A source of the eleventh NMOS transistor NM11 may be coupled to the second power rail 232.

In the present embodiment, the first to fourth PMOS transistors PM1-PM4 and the first to eleventh NMOS transistors NM1-NM11, which constitute the power clamp circuit 200, may be transistors for a low voltage. For example, each of the first to fourth PMOS transistors PM1-PM4 and the first to eleventh NMOS transistors NM1-NM11 may be manufactured to have an operating voltage of approximately 1.2 V. When the electronic device 100 described with reference to FIG. 1 is in normal operation, a high voltage, for example, a supply voltage VDD of approximately 3.3 V, may be applied through the first power rail 231. In this case, although the first to fourth PMOS transistors PM1-PM4 and the first to eleventh NMOS transistors NM1-NM11 are used for the operating voltage of 1.2 V, the gate-drain voltage, gate-source voltage, and drain-source voltage of each of the first to fourth PMOS transistors PM1-PM4 and the first to eleventh NMOS transistors NM1-NM11 might not exceed 110% of the operating voltage of 1.2 V. Here, the voltage corresponding to 110% of the operating voltage of 1.2 V may be defined as the reliability guarantee voltage of a transistor, which ensures the reliability of the transistor. In other words, the reliability of the transistor may be maintained as long as the gate-drain voltage, gate-source voltage, and drain-source voltage of the transistor are less than the reliability guarantee voltage, and this will be described in more detail with reference to FIG. 4 below.

Figure 3:
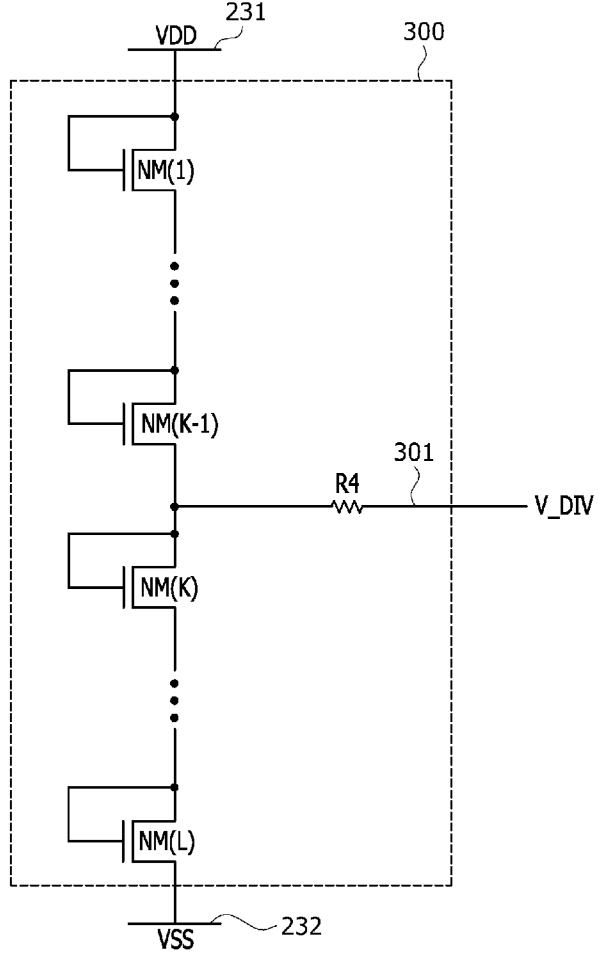
FIG. 3 is a circuit diagram illustrating an example of a voltage branch circuit that provides a branch voltage to a first triggering circuit included in a power clamp circuit of FIG. 2 according to an embodiment of the present disclosure.

FIG. 3 is a circuit diagram illustrating an example of a voltage branch circuit that provides a branch voltage V_DIV to a first triggering circuit included in a power clamp circuit 200 of FIG. 2 according to an embodiment of the present disclosure.

Referring to FIG. 3, a voltage branch circuit 300 may include a plurality of, for example, an "L" number (where "L" is a natural number) of NMOS transistors NM(1)-NM(L) and a fourth resistor R4 coupled and disposed between a first power rail 231 and a second power rail 232. Each of the NMOS transistors NM(1)-NM(L) may have a diode-connected structure in which a gate and a drain are directly connected. The diode-connected NMOS transistors NM(1)-NM(L) may all operate only in the saturation region, and thus, may perform the same functions as resistors. Drain and gate of the first diode-coupled NMOS transistor NM(1) may be coupled to the first power rail 231. A source of a "K−1"$^{th}$ ("K" is a natural number smaller than "L") diode-connected NMOS transistor NM(K−1) may be coupled to drain and gate of a "K"$^{th}$ diode-connected NMOS transistor NM(K). A source of the "L" diode-coupled NMOS transistor NM(L) may be coupled to the second power rail 232.

An output line 301 of the voltage branch circuit 300 may be coupled to the source of a "K−1"$^{th}$ diode-connected NMOS transistor NM(K−1) and the drain and gate of the "K"$^{th}$ diode-connected NMOS transistor NM(K). The fourth resistor R4 may be disposed on the output line 301 of the voltage branch circuit 300. The branch voltage V_DIV may have a magnitude obtained by subtracting the voltage dropped by the first diode-connected NMOS transistor NM(1) to the "K−1"$^{th}$ diode-connected NMOS transistor NM(K−1) and the voltage dropped by the fourth resistor R4 from the supply voltage VDD applied through the first power rail 231. Accordingly, the magnitude of the branch voltage V_DIV may be adjusted in various ways by adjusting the position of the output line 301. In an embodiment, the branch voltage V_DIV may have a magnitude of approximately 60% of the supply voltage VDD. Although not shown in FIG. 3, when an ESD event in which an ESD voltage is applied to the first power rail 231 occurs, the branch voltage V_DIV may have a magnitude of approximately 60% of the ESD voltage VESD.

Figure 4:
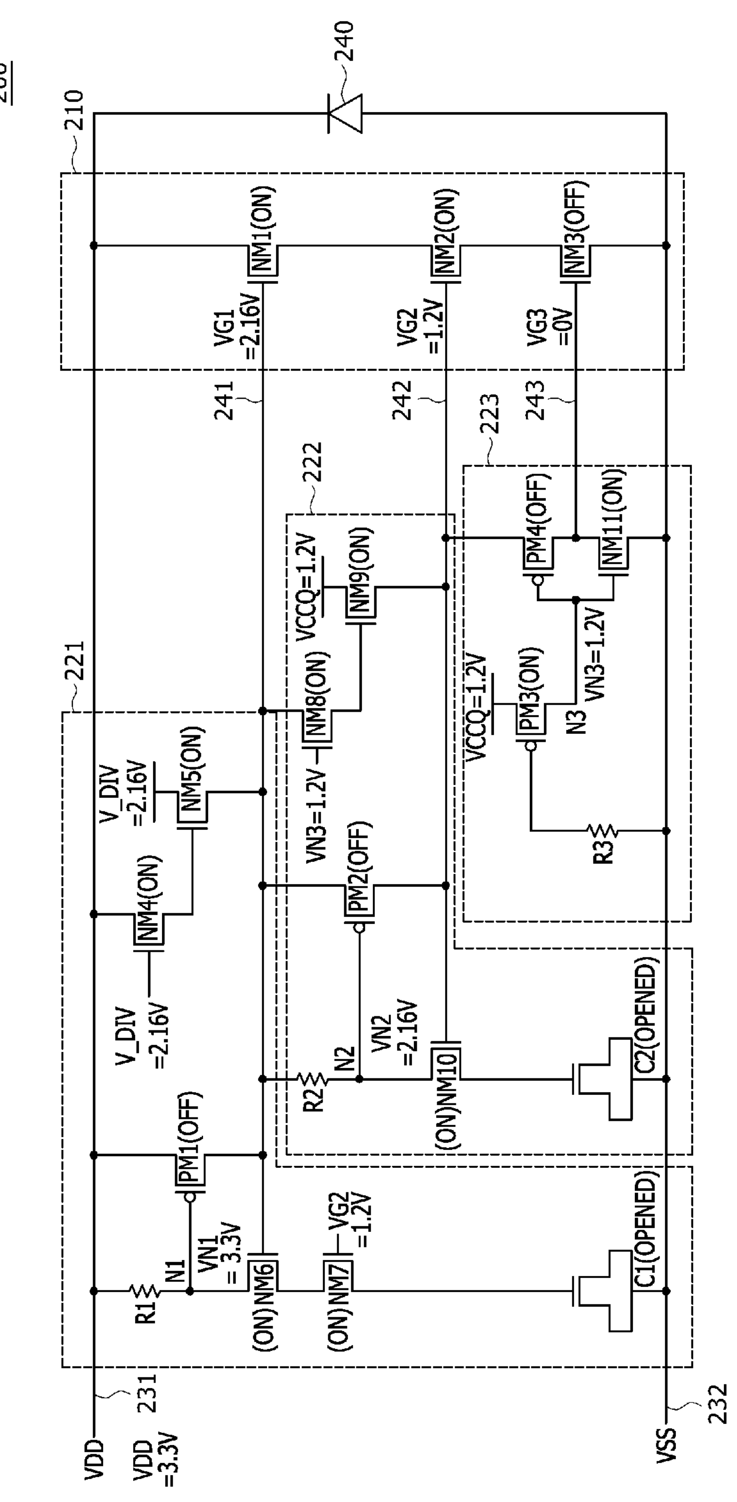
FIG. 4 is a circuit diagram illustrating an example of a normal operation of a power clamp circuit of FIG. 2 according to an embodiment of the present disclosure.

FIG. 4 is a circuit diagram illustrating an example of a normal operation of a power clamp circuit of FIG. 2 according to an embodiment of the present disclosure. In an example, when an electronic device (100 in FIG. 1) including a power clamp circuit 200 operates normally, a voltage of 3.3 V is the applied supply voltage VDD and a voltage of 1.2 V is the applied external power supply voltage VCCQ. In addition, first to fourth PMOS transistors PM1-PM4 and first to eleventh NMOS transistors NM1-NM11, which constitute the power clamp circuit 200, correspond to transistors each having an operating voltage of 1.2 V. Furthermore, a branch voltage V_DIV of a voltage branch circuit (300 in FIG. 3) corresponds to 60% of a supply voltage VDD of 3.3 V, that is, 2.16 V.

Referring to FIG. 4, when the supply voltage VDD of 3.3 V is applied to a first power rail 231, a first capacitor C1 of a first triggering circuit 221 may form an open circuit, and no current may flow through a first resistor R1 of the first triggering circuit 221. Accordingly, a first node voltage VN1 at a first node N1 is 3.3 V, which is the supply voltage VDD. That is, a voltage of 3.3 V may be applied to the gate of the first PMOS transistor PM1 of the first triggering circuit 221. Because the source of the first PMOS transistor PM1 is coupled to the first power rail 231, the voltage of 3.3 V, which is the supply voltage VDD, may also be applied to the source of the first PMOS transistor PM1. Accordingly, the first PMOS transistor PM1 may be turned off.

The branch voltage V_DIV output from the voltage branch circuit (300 in FIG. 3), the voltage of 2.16 V, may be applied to the gate of the fourth NMOS transistor NM4 of the first triggering circuit 221, and accordingly, the fourth NMOS transistor NM4 may be turned on. Because the fourth NMOS transistor NM4 acts as a pass transistor, the voltage obtained by subtracting the threshold voltage of the fourth NMOS transistor NM4 from the voltage of 2.16 V, which is the branch voltage V_DIV, may be applied to the source of the fourth NMOS transistor NM4, which is connected to the gate of the fifth NMOS transistor NM5. Hereinafter, the change in voltage magnitude due to the threshold voltage in each MOS transistor will be ignored. The voltage of 2.16 V, which is the branch voltage V_DIV, may be applied to the gate of the fifth NMOS transistor NM5, and the fifth NMOS transistor NM5 may be turned on. Because the fifth NMOS transistor NM5 also functions as a pass transistor, the branch voltage V_DIV of 2.16 V may be applied to the first gate line 241 coupled to the source of the fifth NMOS transistor NM5. The voltage of 2.16 V applied to the first gate line 241, illustrated in FIG. 4 as a first gate voltage VG1, may be applied to the gate of the first NMOS transistor NM1 of an ESD current discharge circuit 210, and thus the first NMOS transistor NM1 may be turned on. Because the voltage of 2.16 V from the first gate line 241 is applied to the gate of the sixth NMOS transistor NM6, the sixth NMOS transistor NM6 may also be turned on.

When the first gate voltage VG1 of 2.16 V is applied to the first gate line 241, a second capacitor C2 of a second triggering circuit 222 may also form an open circuit like the first capacitor C1. Accordingly, no current may flow through a second resistor R2 of the second triggering circuit 222, and the voltage of 2.16 V, which is the first gate voltage VG1, may be applied to a second node N2, illustrated in FIG. 4 as second node voltage VN2. That is, the voltage of 2.16 V may be applied to the gate of the second PMOS transistor PM2 of the second triggering circuit 222. Because the source of the second PMOS transistor PM2 is coupled to the first gate line 241, the voltage of 2.16 V, which is the first gate voltage VG1, may also be applied to the source of the second PMOS transistor PM2. Accordingly, the second PMOS transistor PM2 may be turned off.

The voltage at a third node N3 of a third triggering circuit 223, illustrated in FIG. 4 as third node voltage VN3, may be applied to the gate of the eighth NMOS transistor NM8 of the second triggering circuit 222. Because the gate of the third PMOS transistor PM3 of the third triggering circuit 223 is coupled to a second power rail 232 through which the ground voltage VSS, that is, 0 V, is applied through a third resistor R3, the third PMOS transistor PM3 may remain turned on. Accordingly, the third node voltage VN3 (i.e., 1.2 V) may become the external power supply voltage VCCQ applied to the source of the third PMOS transistor PM3. As the third node voltage VN3 of 1.2 V is applied to the gate of the eighth NMOS transistor NM8 of the second triggering circuit 222, the eighth NMOS transistor NM8 may be turned on. Because the eighth NMOS transistor NM8 acts as a pass transistor, the voltage of 1.2 V, which is the third node voltage VN3, may be applied to the source of the eighth NMOS transistor NM8, that is, the gate of the ninth NMOS transistor NM9, and the ninth NMOS transistor NM9 may be turned on. Because the ninth NMOS transistor NM9 also acts as a pass transistor, the third node voltage VN3 of 1.2 V may be applied to a second gate line 242 coupled to the source of the ninth NMOS transistor NM9. The voltage of 1.2 V applied to the second gate line 242, illustrated in FIG. 4 as second gate voltage VG2, may be applied to the gate of the second NMOS transistor NM2 of the ESD current discharge circuit 210, and accordingly, the second NMOS transistor NM2 may be turned on. Because the voltage of 1.2 V from the second gate line 242 is also applied to the gate of the tenth NMOS transistor NM10, the tenth NMOS transistor NM10 may also be turned on. As a second gate voltage VG2 of 1.2 V is applied to the gate of the seventh NMOS transistor NM7 of the first triggering circuit 221, the seventh NMOS transistor NM7 may also be turned on.

The third PMOS transistor PM3 of the third triggering circuit 223 may be turned on as a voltage of 0 V is applied to the gate of the third PMOS transistor PM3, and the third node voltage VN3 may become 1.2 V, which is the external power supply voltage VCCQ. The third node voltage VN3 of 1.2 V may become an input voltage of an inverter composed of the fourth PMOS transistor PM4 and the eleventh NMOS transistor NM11. As the fourth PMOS transistor PM4 is turned off and the eleventh NMOS transistor NM11 is turned on, the voltage of 0 V may be applied to the third gate line 243. Accordingly, the voltage of 0 V may be applied to the gate of the third NMOS transistor NM3 of the ESD current discharge circuit 210 as the third gate voltage VG3, and the third NMOS transistor NM3 may be turned off. Accordingly, even when the first NMOS transistor NM1 and the second NMOS transistor NM2 of the ESD current discharge circuit 210 are turned on, as the third NMOS transistor NM3 of the ESD current discharge circuit 210 is turned off, and as a result a current movement path in the ESD current discharge circuit 210 might not be formed.

As described with reference to FIG. 4, when a voltage of 3.3 V, which is a normal input/output voltage, is applied to a pad 110 (not illustrated), all current movement paths between the first power rail 231 and the second power rail 232 may be blocked within the power clamp circuit 200. In normal operation, the supply voltage VDD of 3.3 V applied to the first power rail 231 may be applied to an internal circuit (120 in FIG. 1) through a buffer (150 in FIG. 1). As a result, a voltage less than 1.32 V, which is the reliability guarantee voltage, is applied between gate and drain (gate-drain), between gate and source (gate-source), and between drain and source (drain-source). Therefore, the first to fourth PMOS transistors PM1-PM4 and the first to eleventh NMOS transistors NM1-NM11 constituting the power clamp circuit 200 may be more reliable.

For example, for the first NMOS transistor NM1 of the ESD current discharge circuit 210, the voltages of 2.16 V, 3.3 V, and 2.16 V may be applied to the gate, drain, and source, respectively, and the gate-source voltage, the gate-drain voltage, and the drain-source voltage may become 0 V, 1.14 V, and 1.14 V, respectively, so that the voltages less than 1.32 V may be applied in all cases. For the second NMOS transistor NM2, the voltages of 1.2 V, 2.16 V, and 1.2 V may be applied to the gate, drain, and source, respectively, and the gate-source voltage, the gate-drain voltage, and the drain-source voltage may become 0 V, 0.96 V, and 0.96 V, respectively, so that the voltages less than 1.32 V may be applied in all cases. For the third NMOS transistor NM3, the voltages of 0 V, 1.2 V, and 0 V may be applied to the gate, drain, and source, respectively, and the gate-source voltage, the gate-drain voltage, and the drain-source voltage become 0 V, 1.2 V, and 1.2 V, respectively, so that the voltages less than 1.32 V may be applied in all cases.

For the first PMOS transistor PM1 of the first triggering circuit 221, the voltages of 3.3 V, 3.3 V, and 2.16 V may be applied to the gate, source, and drain, respectively, and the gate-source voltage, the gate-drain voltage, and the drain-source voltage may become 0 V, 1.14 V, and 1.14 V, respectively, so that the voltages less than 1.32 V may be applied in all cases. For the fourth NMOS transistor NM4, the voltages of 2.16 V, 3.3 V, and 2.16 V may be applied to the gate, source, and drain, respectively, and the gate-source voltage, the gate-drain voltage, and the drain-source voltage may become 0 V, 1.14 V, and 1.14 V, respectively, so that the voltages less than 1.32 V may be applied in all cases. For the fifth NMOS transistor NM5, the voltages of 2.16 V, 2.16 V, and 2.16 V may be applied to the gate, drain, and source, respectively, and all of the gate-source voltage, the gate-drain voltage, and the drain-source voltage may become 0 V. For the sixth NMOS transistor NM6, the voltages of 2.16 V, 3.3 V, and 2.16 V may be applied to the gate, drain, and source, respectively, and all of the gate-source voltage, the gate-drain voltage, and the drain-source voltage may become 0 V, 1.14 V, and 1.14 V, so that the voltages less than 1.32 V may be applied in all cases. For the seventh NMOS transistor NM7, the voltages of 1.2 V, 2.16 V, and 1.2 V may be applied to the gate, drain, and source, respectively, and all of the gate-source voltage, the gate-drain voltage, and the drain-source voltage may become 0 V, 0.96 V, and 0.96 V, so that the voltages less than 1.32 V may be applied in all cases.

For the second PMOS transistor PM2 of the second triggering circuit 222, the voltages of 2.16 V, 2.16 V, and 1.2 V may be applied to the gate, source, and drain, respectively, and the gate-source voltage, the gate-drain voltage, and the drain-source voltage may become 0 V, 0.96 V, and 0.96 V, respectively, so that the voltages less than 1.32 V may be applied in all cases. For the eighth NMOS transistor NM8, the voltages of 1.2 V, 2.16 V, and 1.2 V may be applied to the gate, source, and drain, respectively, and the gate-source voltage, the gate-drain voltage, and the drain-source voltage may become 0 V, 0.96 V, and 0.96 V, respectively, so that the voltages less than 1.32 V may be applied in all cases. For the ninth NMOS transistor NM9, the voltages of 1.2 V, 1.2 V, and 1.2 V may be applied to the gate, source, and drain, respectively, and the gate-source voltage, the gate-drain voltage, and the drain-source voltage may all become 0 V. For the tenth NMOS transistor NM10, the voltages of 1.2 V, 2.16 V, and 1.2 V may be applied to the gate, source, and drain, respectively, and the gate-source voltage, the gate-drain voltage, and the drain-source voltage may become 0 V, 0.96 V, and 0.96 V, respectively, so that the voltages less than 1.32 V may be applied in all cases.

For the third PMOS transistor PM3 of the third triggering circuit 223, the voltages of 0 V, 1.2 V, and 1.2 V may be applied to the gate, source, and drain, respectively, and the gate-source voltage, the gate-drain voltage, and the drain-source voltage may become 1.2 V, 1.2 V, and 0 V, respectively, so that the voltages less than 1.32 V may be applied in all cases. For the fourth PMOS transistor PM4, the voltages of 1.2 V, 1.2 V, and 0 V may be applied to the gate, source, and drain, respectively, and the gate-source voltage, the gate-drain voltage, and the drain-source voltage may become 0 V, 1.2 V, and 1.2 V, respectively, so that the voltages less than 1.32 V may be applied in all cases. For the eleventh NMOS transistor NM11, the voltages of 1.2 V, 0 V, and 0 V may be applied to the gate, source, and drain, respectively, and the gate-source voltage, the gate-drain voltage, and the drain-source voltage may become 1.2 V, 1.2 V, and 0 V, respectively, so that the voltages less than 1.32 V may be applied in all cases.

Figure 5:
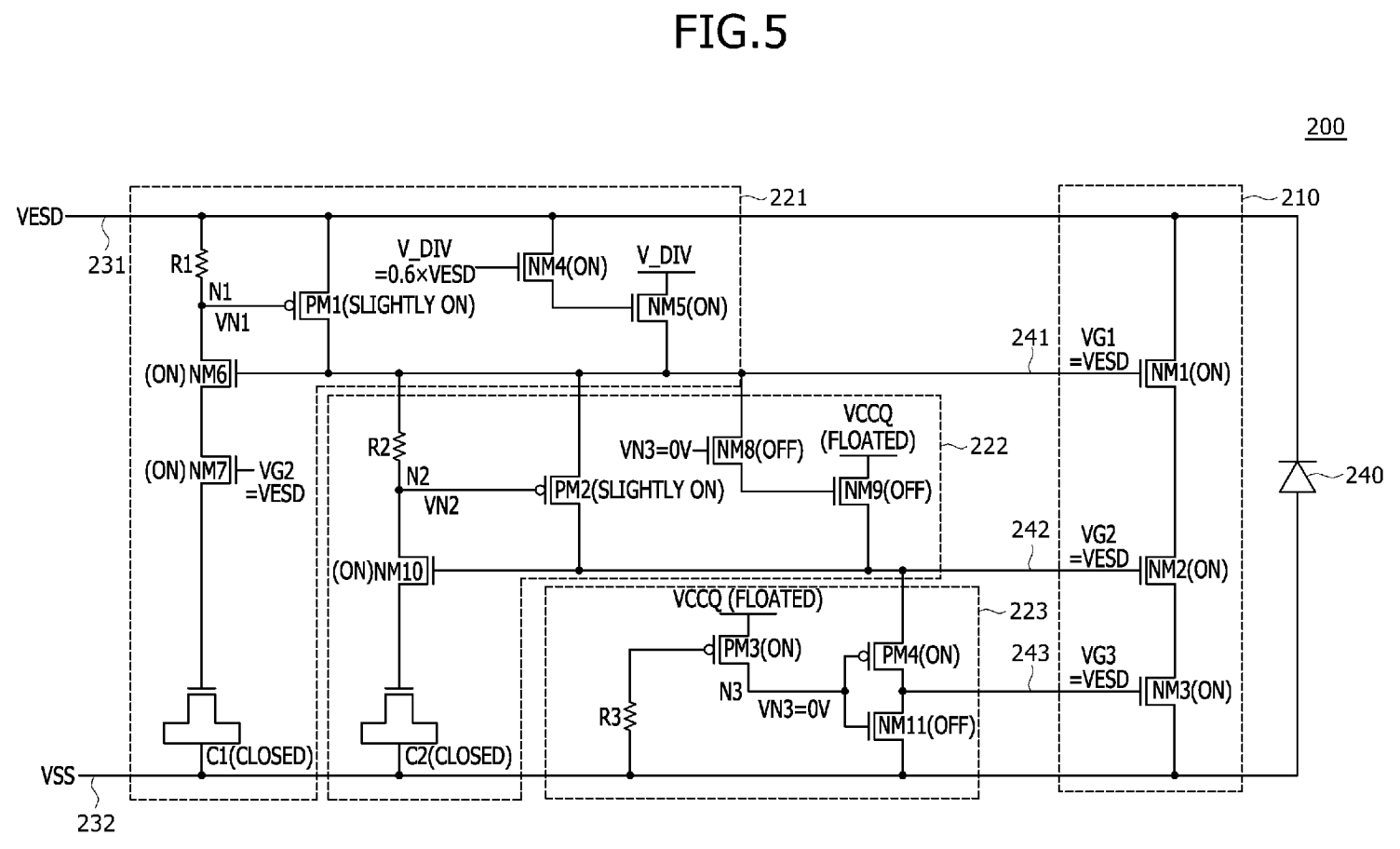

FIG. 5 is a circuit diagram illustrating an example of an electro-static discharge ESD protection operation of a power clamp circuit of FIG. 2 according to an embodiment of the present disclosure. In an example, an ESD event may occur in an electronic device (100 in FIG. 1) including a power clamp circuit 200 when an ESD surge voltage is applied to a pad (110 in FIG. 1). As described above with reference to FIG. 1, an ESD voltage applied to the pad (110 in FIG. 1) is applied to a first power rail 162 through an upper ESD protection circuit 131. In addition, all terminals to which an external power supply voltage VCCQ is applied may be in floating states. In this example, as in the case of FIG. 4, first to fourth PMOS transistors PM1-PM4 and first to eleventh NMOS transistors NM1-NM11 constituting the power clamp circuit 200 each with an operating voltage of 1.2 V are described. A voltage branch circuit (300 in FIG. 3) outputs a branch voltage V_DIV of a magnitude corresponding to 60% of an ESD voltage VESD.

Referring to FIG. 5, when the ESD voltage VESD is applied to a pad 100, a first capacitor C1 of a first triggering circuit 221 may form a closed circuit due to the alternating characteristics of the ESD voltage VESD. The first node voltage VN1, which is less than the ESD voltage VESD, may be applied to a first node N1 of the first triggering circuit 221. The first node voltage VN1 may be applied to the gate of the first PMOS transistor PM1 of the first triggering circuit 221. Because the source of the first PMOS transistor PM1 is coupled to the first power rail 231, the ESD voltage VESD may be applied to the source of the first PMOS transistor PM1. When a difference between the ESD voltage VESD and the first node voltage VN1 becomes greater than the threshold voltage of the first PMOS transistor PM1, the first PMOS transistor PM1 may be turned on. In this case, the first PMOS transistor PM1 might not be fully turned on but may be slightly turned on. As the first PMOS transistor PM1 is turned on, the ESD voltage VESD may be applied to a first gate line 241.

A branch voltage V_DIV output from a voltage branch circuit (300 in FIG. 3) may be applied to the gate of the fourth NMOS transistor NM4 of the first triggering circuit 221. As described above, the branch voltage V_DIV may have a magnitude corresponding to 60% of the ESD voltage VESD (i.e., 0.6×VESD). As the branch voltage V_DIV is applied to the gate of the fourth NMOS transistor NM4, the fourth NMOS transistor NM4 may be turned on. Because the fourth NMOS transistor NM4 acts as a pass transistor, the voltage obtained by subtracting the threshold voltage of the fourth NMOS transistor NM4 from the branch voltage V_DIV may be applied to the source of the fourth NMOS transistor NM4, that is, the gate of the fifth NMOS transistor NM5. Hereinafter, the change in voltage magnitude due to the threshold voltage in each MOS transistor will be ignored. The branch voltage V_DIV may be applied to the gate of the fifth NMOS transistor NM5, but the fifth NMOS transistor NM5 may be turned on as the ESD voltage VESD is applied to the source of the fifth NMOS transistor NM5. When the first PMOS transistor PM1 is turned on, the ESD voltage VESD applied to the first gate line 241 may be applied to the gate of the first NMOS transistor NM1 of an ESD current discharge circuit 210 as the first gate voltage VG1, and thus, the first NMOS transistor NM1 may be turned on. Additionally, the ESD voltage VESD applied to the first gate line 241 may also be applied to the gate of the sixth NMOS transistor NM6, and thus, the sixth NMOS transistor NM6 may also be turned on.

When the ESD voltage VESD is applied to the first gate line 241, a second capacitor C2 of a second triggering circuit 222 may also form a closed circuit like the first capacitor C1. A second node voltage VN2, which is less than the ESD voltage VESD applied to the first gate line 241, may be applied to a second node N2 of the second triggering circuit 222. The second node voltage VN2 may be applied to the gate of the second PMOS transistor PM2 of the second triggering circuit 222. Because the source of the second PMOS transistor PM2 is coupled to the first gate line 241, the ESD voltage VESD may be applied to the source of the second PMOS transistor PM2. When a difference between the ESD voltage VESD and the second node voltage VN2 becomes greater than the threshold voltage of the second PMOS transistor PM2, the second PMOS transistor PM2 may be turned on. In this case, the second PMOS transistor PM2 may be in a slightly turned-on state, like the first PMOS transistor PM1. As the second PMOS transistor PM2 is turned on, the ESD voltage VESD may be applied to the second gate line 242.

The voltage at the third node N3 of the third triggering circuit 223 (i.e., third node voltage VN3) may be applied to the gate of the eighth NMOS transistor NM8 of the second triggering circuit 222. Because the gate of the third PMOS transistor PM3 of a third triggering circuit 223 is coupled to a second power rail 232 to which a ground voltage VSS, that is, 0 V, is applied through a third resistor R3, the third PMOS transistor PM3 may remain turned on. During the ESD event, the source of the third PMOS transistor PM3 to which the external power supply voltage VCCQ is provided may be floated, and accordingly, the third node voltage VN3 may become approximately 0 V (strictly, the threshold voltage of the PMOS transistor PM3). As the third node voltage VN3, 0 V, is applied to the gate of the eighth NMOS transistor NM8 of the second triggering circuit 222, the eighth NMOS transistor NM8 may be turned off. As the eighth NMOS transistor NM8 is turned off, the ninth NMOS transistor NM9 may also be turned off.

The ESD voltage VESD applied to the second gate line 242 may be applied to the gate of the second NMOS transistor NM2 of the ESD current discharge circuit 210 as the second gate voltage VG2, and thus, the second NMOS transistor NM2 may be turned on. Because the ESD voltage VESD applied to the second gate line 242 is also applied to the gate of the tenth NMOS transistor NM10, the tenth NMOS transistor NM10 may also be turned on. As the tenth NMOS transistor NM10 is turned on, the state of the second PMOS transistor PM2 may be changed from the slightly turned-on state to a fully turned-on state. The ESD voltage VESD applied to the second gate line 242 may also be applied to the gate of the seventh NMOS transistor NM7 of the first triggering circuit 221, and thus, the seventh NMOS transistor NM7 may be turned on. As the seventh NMOS transistor NM7 is turned on, the state of first PMOS transistor PM1 may also be changed from the slightly turned-on state to the fully turned-on state.

The third PMOS transistor PM3 of the third triggering circuit 223 may be turned on when the voltage of 0 V is applied to the gate of the third PMOS transistor PM3. However, because the source of the third PMOS transistor PM3 is floated, the third node voltage VN3 may become approximately 0 V. The voltage of 0 V, which is the third node voltage VN3, may be an input voltage of an inverter constituted with the fourth PMOS transistor PM4 and the eleventh NMOS transistor NM11. As the fourth PMOS transistor PM4 is turned on and the eleventh NMOS transistor NM11 is turned off, the ESD voltage VESD may be applied to a third gate line 243. Accordingly, the ESD voltage VESD may be applied to the gate of the third NMOS transistor NM3 of the ESD current discharge circuit 210 as a third gate voltage VG3, and the third NMOS transistor NM3 may be turned on. When the first NMOS transistor NM1, the second NMOS transistor NM2, and the third NMOS transistor NM3 of the ESD current discharge circuit 210 are all turned on, the ESD current may be discharged from the first power rail 231 to the second power rail 232 through the first NMOS transistor NM1, the second NMOS transistor NM2, and the third NMOS transistor NM3. The turned-on states of the first NMOS transistor NM1, the second NMOS transistor NM2, and the third NMOS transistor NM3 of the ESD current discharge circuit 210 may be maintained for a time interval corresponding to a first RC delay time from the first resistor R1 and the first capacitor C1 of the first triggering circuit 221 (same as the second RC delay time from the second resistor R2 and the second capacitor C2 of the second triggering circuit 222).

Figure 6:
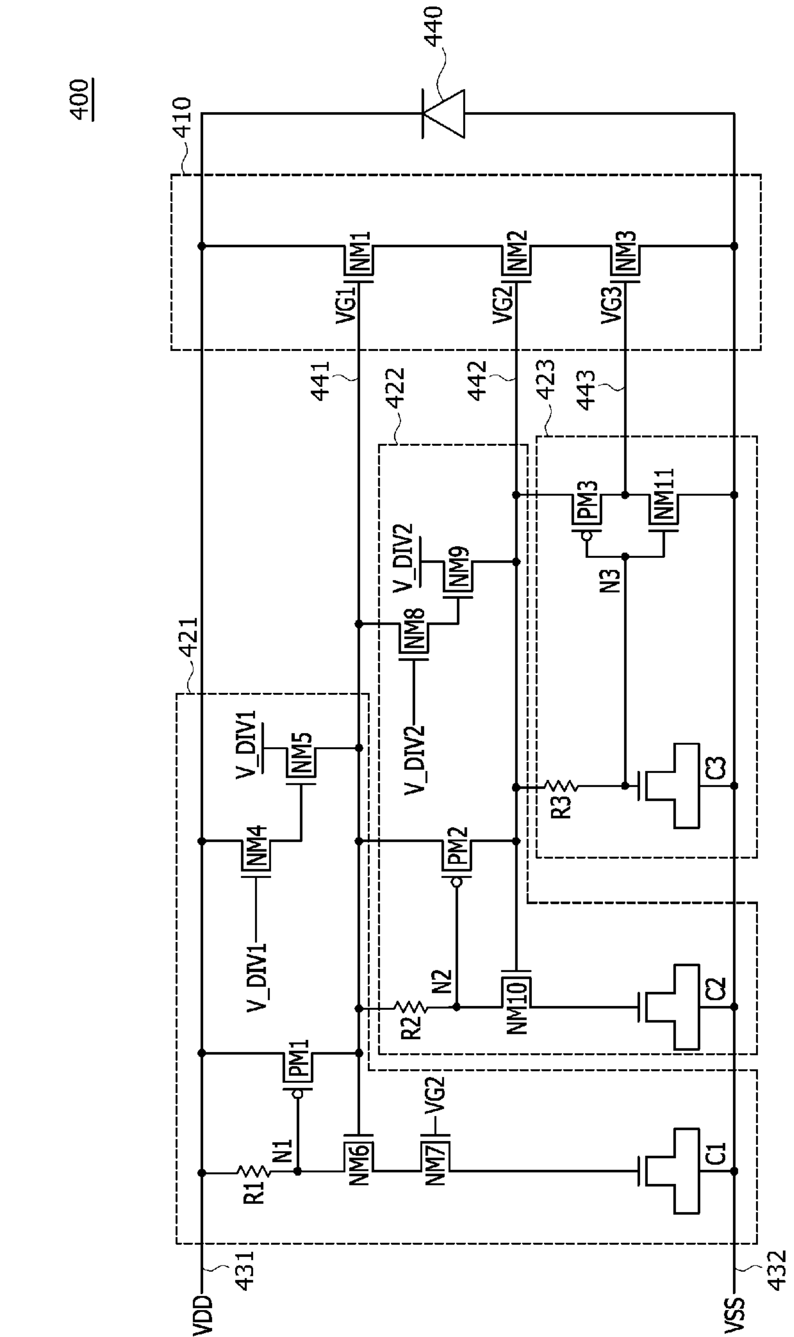
FIG. 6 is a circuit diagram illustrating a power clamp circuit according to other embodiment of the present disclosure.

FIG. 6 is a circuit diagram illustrating a power clamp circuit according to other embodiment of the present disclosure. A power clamp circuit 400 may be utilized as a power clamp circuit 140 included in an electronic device 100 described above with reference to FIG. 1.

Referring to FIG. 6, the power clamp circuit 400 may include an ESD current discharge circuit 410, a first triggering circuit 421, a second triggering circuit 422, and a third triggering circuit 423. Like the power clamp circuit (140 in FIG. 1) described with reference to FIG. 1, the power clamp circuit 400 may protect an internal circuit (120 in FIG. 1) from an ESD surge (or an ESD current) when an ESD event occurs. The power clamp circuit 400 may include a diode 440. The diode 440 may be disposed between a first power rail 431 and a second power rail 432. In an embodiment, the first power rail 431 and the second power rail 432 may be lines through which a supply voltage VDD and a ground voltage VSS are provided, respectively, and may correspond to the second voltage line (162 in FIG. 1) and the third voltage line (163 in FIG. 1) described with reference to FIG. 1, respectively. A cathode and an anode of the diode 440 may be coupled to the first power rail 431 and the second power rail 432, respectively. The diode 440 may provide an ESD current path from the second power rail 432 to the first power rail 431 when a negative ESD event occurs.

The ESD current discharge circuit 410 may include a first MOS transistor NM1, a second MOS transistor NM2, and a third MOS transistor NM3, which are disposed in series between the first power rail 431 and the second power rail 432. Each of the first MOS transistor NM1, the second MOS transistor NM2, and the third MOS transistor NM3 may be an N-channel type MOS (hereinafter, "NMOS") transistor. In embodiments disclosed herein, the first MOS transistor NM1, the second MOS transistor NM2, and the third MOS transistor NM3 may be referred to as a first NMOS transistor NM1, a second NMOS transistor NM2, and a third NMOS transistor NM3, respectively, and each of the first NMOS transistor NM1, the second NMOS transistor NM2, and the third NMOS transistor NM3 may be implemented using a big MOSFET.

A gate of the first NMOS transistor NM1 may be coupled to a first gate line 441. Accordingly, the first NMOS transistor NM1 may be turned on or turned off depending on a first gate voltage VG1 applied to the first gate line 441. A drain of the first NMOS transistor NM1 may be coupled to the first power rail 431. A source of the first NMOS transistor NM1 may be coupled to a drain of the second NMOS transistor NM2. A gate of the second NMOS transistor NM2 may be coupled to a second gate line 442. Accordingly, the second NMOS transistor NM2 may be turned on or turned off depending on a second gate voltage VG2 applied to the second gate line 442. A source of the second NMOS transistor NM2 may be coupled to a drain of the third NMOS transistor NM3. A gate of the third NMOS transistor NM3 may be coupled to a third gate line 443. Accordingly, the third NMOS transistor NM3 may be turned on or turned off depending on a third gate voltage VG3 applied to the third gate line 443. A source of the third NMOS transistor NM3 may be coupled to the second power rail 432.

The first triggering circuit 421 may include a first resistor R1, a first capacitor C1, and a fourth MOS transistor PM1.

The first capacitor C1 may be a MOS capacitor. The fourth MOS transistor PM1 may be a P-channel type MOS (hereinafter, "PMOS") transistor. In embodiments disclosed herein, the fourth MOS transistor PM1 may be referred to as a first PMOS transistor PM1. The second triggering circuit 422 may include a second resistor R2, a second capacitor C2, and a fifth MOS transistor PM2. The second capacitor C2 may be a MOS capacitor. The fifth MOS transistor PM2 may be a PMOS transistor. The third triggering circuit 423 may include a third resistor R3 and a third capacitor C3. In embodiments disclosed herein, the fifth MOS transistor PM2 may be referred to as a second PMOS transistor PM2. A resistance of the first resistor R1, a capacitance of the first capacitor C1, a resistance of the second resistor R2, and a capacitance of the second capacitor C2, and a resistance of the third resistor R3, and a capacitance of the third capacitor C3 may be set so that a first RC delay value, obtained by multiplying the resistance of the first resistor R1 and the capacitance of the first capacitor C1, a second RC delay value, obtained by multiplying the resistance of the second resistor R2 and the capacitance of the second capacitor C2, and a third RC delay value, obtained by multiplying the resistance of the third resistor R3 and the capacitance of the third capacitor C3 are the same.

The first triggering circuit 421 may include a sixth MOS transistor NM4, a seventh MOS transistor NM5, an eighth MOS transistor NM6, and a ninth MOS transistor NM7. Each of the sixth MOS transistor NM4, the seventh MOS transistor NM5, the eighth MOS transistor NM6, and the ninth MOS transistor NM7 may be an NMOS transistor. Hereinafter, the sixth MOS transistor NM4, the seventh MOS transistor NM5, the eighth MOS transistor NM6, and the ninth MOS transistor NM7 may be referred to respectively as a fourth NMOS transistor NM4, a fifth NMOS transistor NM5, a sixth NMOS transistor NM6, and a seventh NMOS transistor NM7.

The second triggering circuit 422 may include a tenth MOS transistor NM8, an eleventh MOS transistor NM9, and a twelfth MOS transistor NM10. Each of the tenth MOS transistor NM8, the eleventh MOS transistor NM9, and the twelfth MOS transistor NM10 may be an NMOS transistor. Hereinafter, the tenth MOS transistor NM8, the eleventh MOS transistor NM9, and the twelfth MOS transistor NM10 may be referred to respectively as an eighth NMOS transistor NM8, a ninth NMOS transistor NM9, and a tenth NMOS transistor NM10.

The third triggering circuit 423 may include the third resistor R3, the third capacitor C3, and an inverter circuit. The inverter circuit may include a thirteenth MOS transistor PM3 and a fifteenth MOS transistor NM11. The thirteenth MOS transistor PM3 may be a PMOS transistor. The fifteenth MOS transistor NM11 may be an NMOS transistor. Hereinafter, the thirteenth MOS transistor PM3 and the fifteenth MOS transistor NM11 may be referred to respectively as a third PMOS transistor PM3 and an eleventh NMOS transistor NM11.

In more detail, the first resistor R1 of the first triggering circuit 421 may be disposed between the first power rail 431 and a first node N1. A gate of the first PMOS transistor PM1 may be coupled to the first node N1. A source of the first PMOS transistor PM1 may be coupled to the first power rail 431. A drain of the first PMOS transistor PM1 may be coupled to the first gate line 441. A gate of the fourth NMOS transistor NM4 may be coupled to a first branch voltage V_DIV1. Although not shown in FIG. 6, the first branch voltage V_DIV1 may be generated by a voltage branch circuit. The voltage branch circuit will be described in more detail with reference to FIG. 7 below. A drain of the fourth NMOS transistor NM4 may be coupled to the first power rail 431. A source of the fourth NMOS transistor NM4 may be coupled to a gate of the fifth NMOS transistor NM5. A drain of the fifth NMOS transistor NM5 may be coupled to the first branch voltage V_DIV1. A source of the fifth NMOS transistor NM5 may be coupled to the first gate line 441. In an embodiment, the fourth NMOS transistor NM4 and the fifth NMOS transistor NM5 may be pass transistors that transfer the voltage applied to the gate to source outputs.

A gate of the sixth NMOS transistor NM6 may be coupled to the first gate line 441. A drain of the sixth NMOS transistor NM6 may be coupled to the first node N1. A source of the sixth NMOS transistor NM6 may be couped to a drain of the seventh NMOS transistor NM7. A gate of the seventh NMOS transistor NM7 may be coupled to the second gate line 442. Accordingly, the same second gate voltage VG2 applied to the gate of the second NMOS transistor NM2 may be applied to the gate of the seventh NMOS transistor NM7. A source of the seventh NMOS transistor NM7 may be coupled to the first capacitor C1. The first capacitor C1 may be disposed between the seventh NMOS transistor NM7 and the second power rail 432. When the first capacitor C1 is a MOS capacitor, the source of the seventh NMOS transistor NM7 may be coupled to a gate of the MOS capacitor.

The second resistor R2 of the second triggering circuit 422 may be disposed between the first gate line 441 and a second node N2. A gate of the second PMOS transistor PM2 may be coupled to the second node N2. A source of the second PMOS transistor PM2 may be coupled to the first gate line 441. A drain of the second PMOS transistor PM2 may be coupled to the second gate line 442. A gate of the eighth NMOS transistor NM8 may be coupled to a second branch voltage V_DIV2. Although not shown in FIG. 6, the second branch voltage V_DIV2 may be generated by the voltage branch circuit. The second branch voltage V_DIV2 has a smaller magnitude than the first branch voltage V_DIV1. A drain of the eighth NMOS transistor NM8 may be coupled to the first gate line 441. A source of the eighth NMOS transistor NM8 may be coupled to a gate of the ninth NMOS transistor NM9. A drain of the ninth NMOS transistor NM9 may be coupled to the second branch voltage V_DIV2. The external power supply voltage VCCQ may have a magnitude less than the supply voltage VDD. A source of the ninth NMOS transistor NM9 may be coupled to the second gate line 442. In an embodiment, the eighth NMOS transistor NM8 and the ninth NMOS transistor NM9 may be pass transistors that transfer the voltage applied to the gate to the source output. A gate of the tenth NMOS transistor NM10 may be coupled to the second gate line 442. A drain of the tenth NMOS transistor NM10 may be coupled to the second node N2. A source of the tenth NMOS transistor NM10 may be coupled to the second capacitor C2. The second capacitor C2 may be disposed between the tenth NMOS transistor NM10 and the second power rail 432. When the second capacitor C2 is a MOS capacitor, the source of the tenth NMOS transistor NM10 may be coupled to the gate of the MOS capacitor.

The third resistor R3 of the third triggering circuit 423 may be disposed between the second gate line 442 and a third node N3. The third node N3 may be coupled to input line of the inverter circuit. The third capacitor C3 of the third triggering circuit 423 may be disposed between the third node N3 and the second power rail 432. When the third capacitor C3 is a MOS capacitor, the gate of the MOS capacitor may be coupled to the third node N3. The third PMOS transistor PM3 and the eleventh NMOS transistor NM11 may constitute the inverter circuit of the third triggering circuit 423. That is, a gate of the third PMOS transistor PM3 and a gate of the eleventh NMOS transistor NM11 may be commonly coupled to the third node N3. A drain of the third PMOS transistor PM3 and a drain of the eleventh NMOS transistor NM11 may be commonly coupled to a third gate line 443. A source of the third PMOS transistor PM3 may be coupled to the second gate line 442. A source of the eleventh NMOS transistor NM11 may be coupled to the second power rail 432.

In the present embodiment, the first to third PMOS transistors PM1-PM3 and the first to eleventh NMOS transistors NM1-NM11, which constitute the power clamp circuit 400, may be transistors for a low voltage. Here, the low voltage is a voltage that is smaller than the supply voltage (VDD), which is a high voltage. For example, each of the first to third PMOS transistors PM1-PM3 and the first to eleventh NMOS transistors NM1-NM11 may be manufactured to have an operating voltage of approximately 1.2 V. When the electronic device 100 described with reference to FIG. 1 is in normal operation, a high voltage, for example, a supply voltage VDD of approximately 3.3 V, may be applied through the first power rail 431. In this case, although the first to third PMOS transistors PM1-PM3 and the first to eleventh NMOS transistors NM1-NM11 are used for the operating voltage of 1.2 V, the gate-drain voltage, gate-source voltage, and drain-source voltage of each of the first to third PMOS transistors PM1-PM3 and the first to eleventh NMOS transistors NM1-NM11 might not exceed 110% of the operating voltage of 1.2 V. Here, the voltage corresponding to 110% of the operating voltage of 1.2 V may be defined as the reliability guarantee voltage of a transistor, which ensures the reliability of the transistor. In other words, the reliability of the transistor may be maintained as long as the gate-drain voltage, gate-source voltage, and drain-source voltage of the transistor are less than the reliability guarantee voltage, and this will be described in more detail with reference to FIG. 8 below.

Figure 7:
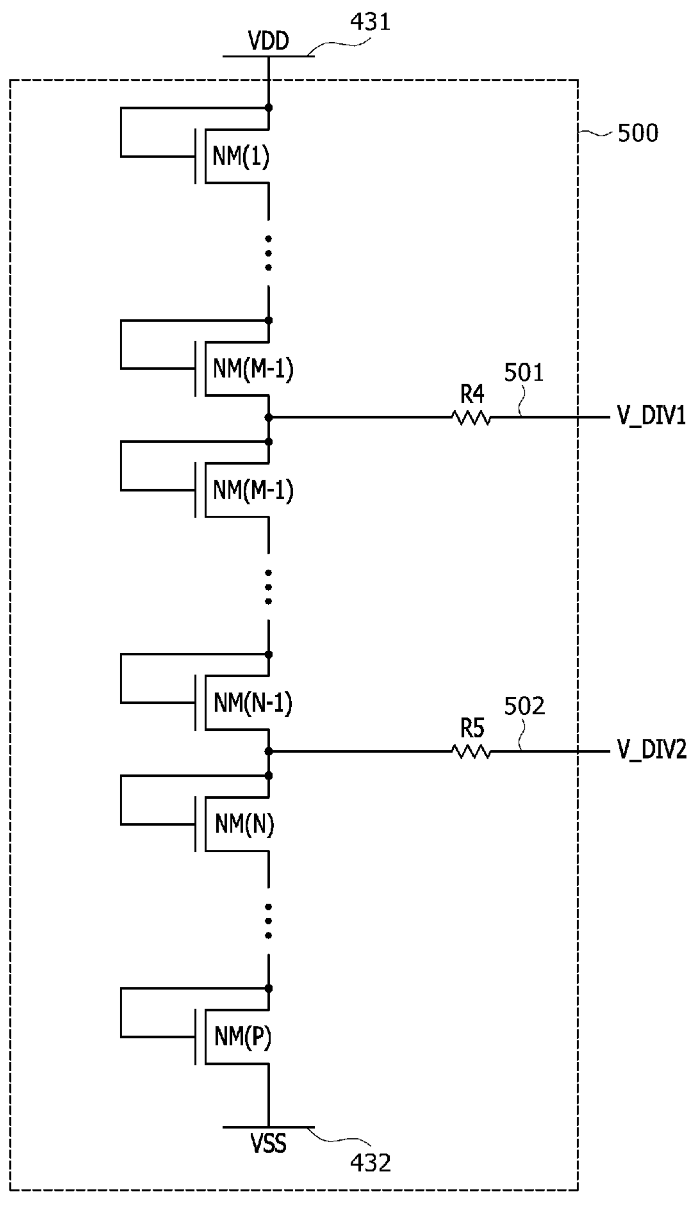
FIG. 7 is a circuit diagram illustrating an example of a voltage branch circuit that provides a first branch voltage and a second branch voltage to a first triggering circuit and a second triggering circuit included in a power clamp circuit of FIG. 6, respectively, according to other embodiment of the present disclosure.

FIG. 7 is a circuit diagram illustrating an example of a voltage branch circuit that provides a first branch voltage V_DIV1 and a second branch voltage V_DIV2 to a first triggering circuit and a second triggering circuit included in a power clamp circuit 400 of FIG. 6, respectively, according to other embodiment of the present disclosure.

Referring to FIG. 7, a voltage branch circuit 500 may include a plurality of, for example, a "P" number (where "P" is a natural number) of NMOS transistors NM(1)-NM(P), a fourth resistor R4, and a fifth resistor R5 coupled and disposed between a first power rail 431 and a second power rail 432. Each of the NMOS transistors NM(1)-NM(P) may have a diode-connected structure in which a gate and a drain are directly connected. The diode-connected NMOS transistors NM(1)-NM(P) may all operate only in the saturation region, and thus, may perform the same functions as resistors.

Drain and gate of the first diode-coupled NMOS transistor NM(1) may be coupled to the first power rail 431. A source of a "M−1"$^{th}$ ("M" is a natural number smaller than "P") diode-connected NMOS transistor NM(M−1) may be coupled to drain and gate of a "M"$^{th}$ diode-connected NMOS transistor NM(M). A source of a "N−1"$^{th}$ ("N" is a natural number larger than "M" and smaller than "P") diode-connected NMOS transistor NM(N−1) may be coupled to drain and gate of a "N"$^{th}$ diode-connected NMOS transistor NM(N). A source of the "P"$^{th}$ diode-coupled NMOS transistor NM(P) may be coupled to the second power rail 432. Although not shown in the FIG. 7, a source of the first diode-coupled NMOS transistor NM(1) may be coupled to drain and gate of a second diode-coupled NMOS transistor. Gate and drain of the "M−1"$^{th}$ diode-connected NMOS transistor NM(M−1) may be coupled to a source of a "M−2"th diode-connected NMOS transistor. A source of the "M"$^{th}$ diode-coupled NMOS transistor NM(M) may be coupled to drain and gate of a "M+1"$^{th}$ diode-coupled NMOS transistor. Gate and drain of the "N−1"$^{th}$ diode-connected NMOS transistor NM(N−1) may be coupled to a source of a "N−2"th diode-connected NMOS transistor. A source of the "N"$^{th}$ diode-coupled NMOS transistor NM(M) may be coupled to drain and gate of a "N+1"$^{th}$ diode-coupled NMOS transistor. And gate and drain of the "P"$^{th}$ diode-connected NMOS transistor NM(P) may be coupled to a source of a "P−1"$^{th}$ diode-connected NMOS transistor.

The voltage branch circuit 500 may include a first output line 501 and a second output line 502. The first output line 501 of the voltage branch circuit 500 may be coupled to the source of a "M−1"$^{th}$ diode-connected NMOS transistor NM(M−1) and the drain and gate of the "M"$^{th}$ diode-connected NMOS transistor NM(M). The fourth resistor R4 may be disposed on the first output line 501 of the voltage branch circuit 500. The first branch voltage V_DIV1 may have a magnitude obtained by subtracting the voltage dropped by the first diode-connected NMOS transistor NM(1) to the "M−1"$^{th}$ diode-connected NMOS transistor NM(M−1) and the voltage dropped by the fourth resistor R4 from the supply voltage VDD applied through the first power rail 431. Accordingly, the magnitude of the first branch voltage V_DIV1 may be adjusted in various ways by adjusting the position of the first output line 501. In an embodiment, the first branch voltage V_DIV1 may have a magnitude of approximately 60% of the supply voltage VDD. Although not shown in FIG. 7, when an ESD event in which an ESD voltage is applied to the first power rail 431 occurs, the first branch voltage V_DIV1 may have a magnitude of approximately 60% of the ESD voltage VESD.

The second output line 502 of the voltage branch circuit 500 may be coupled to the source of a "N−1"$^{th}$ diode-connected NMOS transistor NM(N−1) and the drain and gate of the "N"$^{th}$ diode-connected NMOS transistor NM(N). The fifth resistor R5 may be disposed on the second output line 502 of the voltage branch circuit 500. The second branch voltage V_DIV2 may have a magnitude obtained by subtracting the voltage dropped by the first diode-connected NMOS transistor NM(1) to the "N−1"$^{th}$ diode-connected NMOS transistor NM(N−1) and the voltage dropped by the fifth resistor R5 from the supply voltage VDD applied through the first power rail 431. Because "N" is a natural number larger than "M", the second branch voltage V_DIV2 has a smaller magnitude than the first branch voltage V_DIV1. The magnitude of the second branch voltage V_DIV2 may be adjusted in various ways by adjusting the position of the second output line 502. In an embodiment, the second branch voltage V_DIV2 may have a magnitude of approximately 30% of the supply voltage VDD. Although not shown in FIG. 7, when an ESD event in which an ESD voltage is applied to the first power rail 431 occurs, the second branch voltage V_DIV2 may have a magnitude of approximately 30% of the ESD voltage VESD.

Figure 8:
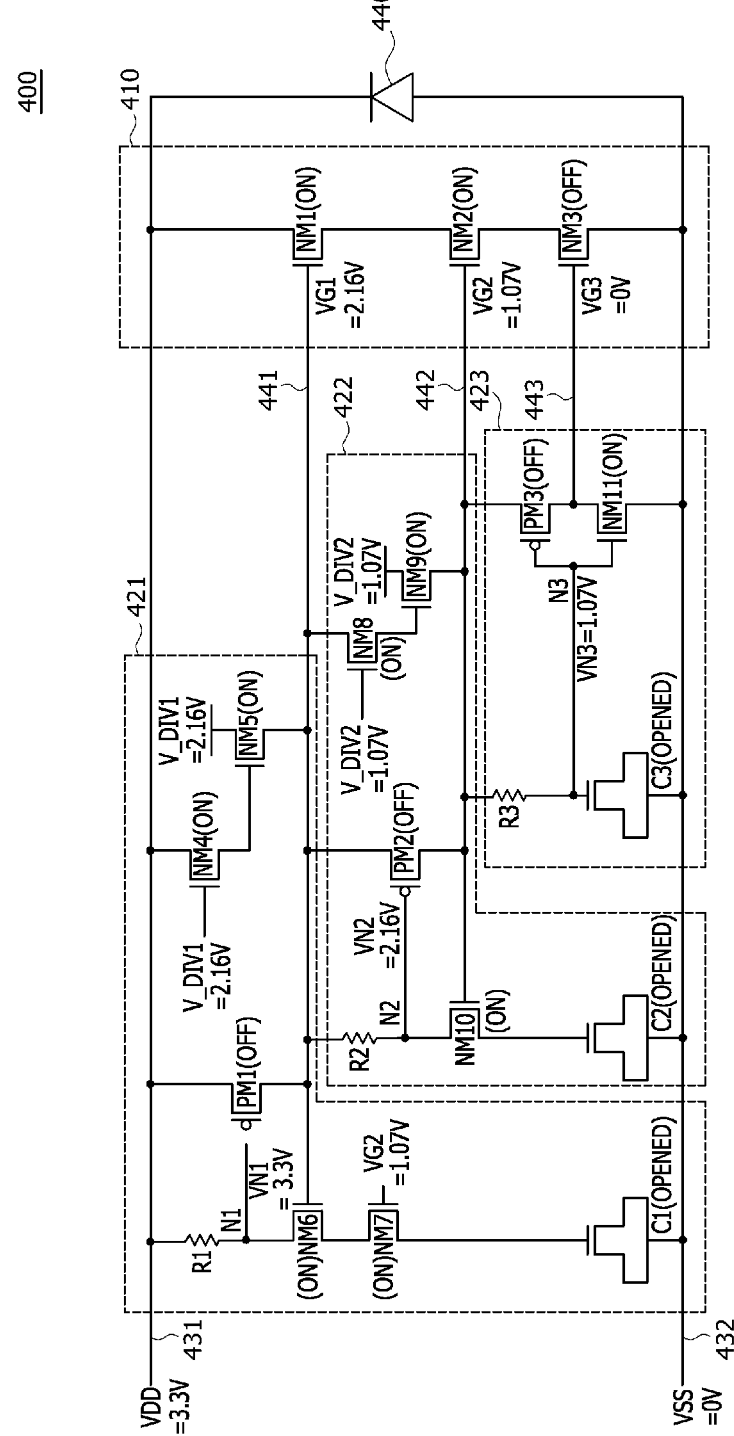
FIG. 8 is a circuit diagram illustrating an example of a normal operation of a power clamp circuit of FIG. 6 according to other embodiment of the present disclosure.

FIG. 8 is a circuit diagram illustrating an example of a normal operation of a power clamp circuit of FIG. 6 according to other embodiment of the present disclosure. In an example, when an electronic device (100 in FIG. 1) including a power clamp circuit 400 operates normally, a voltage of 3.3 V is the applied supply voltage VDD and a voltage of 0 V is the applied ground voltage VSS. The external power supply voltage VCCQ in FIG. 2 is not applied to the power clamp circuit 400. In addition, first to third PMOS transistors PM1-PM3 and first to eleventh NMOS transistors NM1-NM11, which constitute the power clamp circuit 400, correspond to transistors each having an operating voltage of 1.2 V. Furthermore, a first branch voltage V_DIV1 of a voltage branch circuit (500 in FIG. 7) corresponds to 65% of a supply voltage VDD of 3.3 V, that is, 2.16 V. Also, a second branch voltage V_DIV2 of a voltage branch circuit (500 in FIG. 7) corresponds to 35% of a supply voltage VDD of 3.3 V, that is, 1.07 V.

Referring to FIG. 8, when the supply voltage VDD of 3.3 V is applied to a first power rail 431 and the ground voltage VSS of 0 V is applied to a second power rail 432, a first capacitor C1 of a first triggering circuit 421 may form an open circuit, and no current may flow through a first resistor R1 of the first triggering circuit 421. Accordingly, a first node voltage VN1 at a first node N1 is 3.3 V, which is the supply voltage VDD. That is, a voltage of 3.3 V may be applied to the gate of the first PMOS transistor PM1 of the first triggering circuit 421. Because the source of the first PMOS transistor PM1 is coupled to the first power rail 431, the voltage of 3.3 V, which is the supply voltage VDD, may also be applied to the source of the first PMOS transistor PM1. Accordingly, the first PMOS transistor PM1 may be turned off.

The first branch voltage V_DIV1 output from the voltage branch circuit (500 in FIG. 7), the voltage of 2.16 V, may be applied to the gate of the fourth NMOS transistor NM4 of the first triggering circuit 421, and accordingly, the fourth NMOS transistor NM4 may be turned on. Because the fourth NMOS transistor NM4 acts as a pass transistor, the voltage obtained by subtracting the threshold voltage of the fourth NMOS transistor NM4 from the voltage of 2.16 V, which is the first branch voltage V_DIV1, may be applied to the source of the fourth NMOS transistor NM4, which is connected to the gate of the fifth NMOS transistor NM5. Hereinafter, the change in voltage magnitude due to the threshold voltage in each MOS transistor will be ignored. The voltage of 2.16 V, which is the first branch voltage V_DIV1, may be applied to the gate of the fifth NMOS transistor NM5, and the fifth NMOS transistor NM5 may be turned on. Because the fifth NMOS transistor NM5 also functions as a pass transistor, the first branch voltage V_DIV1 of 2.16 V may be applied to the first gate line 441 coupled to the source of the fifth NMOS transistor NM5. The voltage of 2.16 V applied to the first gate line 441, illustrated in FIG. 8 as a first gate voltage VG1, may be applied to the gate of the first NMOS transistor NM1 of an ESD current discharge circuit 410, and thus the first NMOS transistor NM1 may be turned on. Because the voltage of 2.16 V from the first gate line 241 is applied to the gate of the sixth NMOS transistor NM6, the sixth NMOS transistor NM6 may also be turned on.

When the first gate voltage VG1 of 2.16 V is applied to the first gate line 441, a second capacitor C2 of a second triggering circuit 422 may also form an open circuit like the first capacitor C1. Accordingly, no current may flow through a second resistor R2 of the second triggering circuit 422, and the voltage of 2.16 V, which is the first gate voltage VG1, may be applied to a second node N2, illustrated in FIG. 8 as second node voltage VN2. That is, the voltage of 2.16 V may be applied to the gate of the second PMOS transistor PM2 of the second triggering circuit 422. Because the source of the second PMOS transistor PM2 is coupled to the first gate line 441, the voltage of 2.16 V, which is the first gate voltage VG1, may also be applied to the source of the second PMOS transistor PM2. Accordingly, the second PMOS transistor PM2 may be turned off.

The second branch voltage V_DIV2 output from the voltage branch circuit (500 in FIG. 7), the voltage of 1.07 V, may be applied to the gate of the eighth NMOS transistor NM8 of the second triggering circuit 422, and accordingly, the eighth NMOS transistor NM8 may be turned on. Because the eighth NMOS transistor NM8 acts as a pass transistor, the voltage of 1.07 V, which is the second branch voltage V_DIV2, may be applied to the source of the eighth NMOS transistor NM8, that is, the gate of the ninth NMOS transistor NM9, and the ninth NMOS transistor NM9 may be turned on. Because the ninth NMOS transistor NM9 also acts as a pass transistor, the second branch voltage V_DIV2 of 1.07 V may be applied to a second gate line 442 coupled to the source of the ninth NMOS transistor NM9. The voltage of 1.07 V applied to the second gate line 442, illustrated in FIG. 8 as second gate voltage VG2, may be applied to the gate of the second NMOS transistor NM2 of the ESD current discharge circuit 410, and accordingly, the second NMOS transistor NM2 may be turned on. Because the voltage of 1.07 V from the second gate line 442 is also applied to the gate of the tenth NMOS transistor NM10, the tenth NMOS transistor NM10 may also be turned on. As a second gate voltage VG2 of 1.07 V is applied to the gate of the seventh NMOS transistor NM7 of the first triggering circuit 421, the seventh NMOS transistor NM7 may also be turned on.

When the second gate voltage VG2 of 1.07 V is applied to the second gate line 441, a third capacitor C3 of a third triggering circuit 423 may also form an open circuit like the first capacitor C1 and the second capacitor C2. Accordingly, no current may flow through a third resistor R3 of the third triggering circuit 423, and the voltage of 1.07 V, which is the second gate voltage VG2, may be applied to a third node N3, illustrated in FIG. 8 as third node voltage VN3. The third node voltage VN3 of 1.07 V may become an input voltage of an inverter circuit composed of the third PMOS transistor PM3 and the eleventh NMOS transistor NM11. As the third PMOS transistor PM3 is turned off and the eleventh NMOS transistor NM11 is turned on, the voltage of 0 V may be applied to the third gate line 443. Accordingly, the voltage of 0 V may be applied to the gate of the third NMOS transistor NM3 of the ESD current discharge circuit 410 as the third gate voltage VG3, and the third NMOS transistor NM3 may be turned off. Accordingly, even when the first NMOS transistor NM1 and the second NMOS transistor NM2 of the ESD current discharge circuit 410 are turned on, as the third NMOS transistor NM3 of the ESD current discharge circuit 410 is turned off, and as a result a current movement path in the ESD current discharge circuit 410 might not be formed.

As described with reference to FIG. 8, when a voltage of 3.3 V, which is a normal input/output voltage, is applied to a pad 110 (not illustrated), all current movement paths between the first power rail 431 and the second power rail 432 may be blocked within the power clamp circuit 400. In normal operation, the supply voltage VDD of 3.3 V applied to the first power rail 431 may be applied to an internal circuit (120 in FIG. 1) through a buffer (150 in FIG. 1). As a result, a voltage less than 1.32 V, which is the reliability guarantee voltage, is applied between gate and drain (gate-drain), between gate and source (gate-source), and between drain and source (drain-source). Therefore, the first to third PMOS transistors PM1-PM3 and the first to eleventh NMOS transistors NM1-NM11 constituting the power clamp circuit 400 may be more reliable.

For example, for the first NMOS transistor NM1 of the ESD current discharge circuit 410, the voltages of 2.16 V, 3.3 V, and 2.16 V may be applied to the gate, drain, and source, respectively, and the gate-source voltage, the gate-drain voltage, and the drain-source voltage may become 0 V, 1.14 V, and 1.14 V, respectively, so that the voltages less than 1.32 V may be applied in all cases. For the second NMOS transistor NM2, the voltages of 1.07 V, 2.16 V, and 1.07 V may be applied to the gate, drain, and source, respectively, and the gate-source voltage, the gate-drain voltage, and the drain-source voltage may become 0 V, 1.09 V, and 1.09 V, respectively, so that the voltages less than 1.32 V may be applied in all cases. For the third NMOS transistor NM3, the voltages of 0 V, 1.07 V, and 0 V may be applied to the gate, drain, and source, respectively, and the gate-source voltage, the gate-drain voltage, and the drain-source voltage become 0 V, 1.07 V, and 1.07 V, respectively, so that the voltages less than 1.32 V may be applied in all cases.

For the first PMOS transistor PM1 of the first triggering circuit 421, the voltages of 3.3 V, 3.3 V, and 2.16 V may be applied to the gate, source, and drain, respectively, and the gate-source voltage, the gate-drain voltage, and the drain-source voltage may become 0 V, 1.14 V, and 1.14 V, respectively, so that the voltages less than 1.32 V may be applied in all cases. For the fourth NMOS transistor NM4, the voltages of 2.16 V, 3.3 V, and 2.16 V may be applied to the gate, source, and drain, respectively, and the gate-source voltage, the gate-drain voltage, and the drain-source voltage may become 0 V, 1.14 V, and 1.14 V, respectively, so that the voltages less than 1.32 V may be applied in all cases. For the fifth NMOS transistor NM5, the voltages of 2.16 V, 2.16 V, and 2.16 V may be applied to the gate, drain, and source, respectively, and all of the gate-source voltage, the gate-drain voltage, and the drain-source voltage may become 0 V. For the sixth NMOS transistor NM6, the voltages of 2.16 V, 3.3 V, and 2.16 V may be applied to the gate, drain, and source, respectively, and all of the gate-source voltage, the gate-drain voltage, and the drain-source voltage may become 0 V, 1.14 V, and 1.14 V, so that the voltages less than 1.32 V may be applied in all cases. For the seventh NMOS transistor NM7, the voltages of 1.07 V, 2.16 V, and 1.07 V may be applied to the gate, drain, and source, respectively, and all of the gate-source voltage, the gate-drain voltage, and the drain-source voltage may become 0 V, 1.09 V, and 1.09 V, so that the voltages less than 1.32 V may be applied in all cases.

For the second PMOS transistor PM2 of the second triggering circuit 422, the voltages of 2.16 V, 2.16 V, and 1.07 V may be applied to the gate, source, and drain, respectively, and the gate-source voltage, the gate-drain voltage, and the drain-source voltage may become 0 V, 1.09 V, and 1.09 V, respectively, so that the voltages less than 1.32 V may be applied in all cases. For the eighth NMOS transistor NM8, the voltages of 1.07 V, 2.16 V, and 1.07 V may be applied to the gate, source, and drain, respectively, and the gate-source voltage, the gate-drain voltage, and the drain-source voltage may become 0 V, 1.09 V, and 1.09 V, respectively, so that the voltages less than 1.32 V may be applied in all cases. For the ninth NMOS transistor NM9, the voltages of 1.07 V, 1.07 V, and 1.07 V may be applied to the gate, source, and drain, respectively, and the gate-source voltage, the gate-drain voltage, and the drain-source voltage may all become 0 V. For the tenth NMOS transistor NM10, the voltages of 1.07 V, 2.16 V, and 1.07 V may be applied to the gate, source, and drain, respectively, and the gate-source voltage, the gate-drain voltage, and the drain-source voltage may become 0 V, 1.09 V, and 1.09 V, respectively, so that the voltages less than 1.32 V may be applied in all cases.

For the third PMOS transistor PM3 of the third triggering circuit 423, the voltages of 1.07 V, 1.07 V, and 0 V may be applied to the gate, source, and drain, respectively, and the gate-source voltage, the gate-drain voltage, and the drain-source voltage may become 0 V, 1.07 V, and 1.07 V, respectively, so that the voltages less than 1.32 V may be applied in all cases. For the eleventh NMOS transistor NM11, the voltages of 1.07 V, 0 V, and 0 V may be applied to the gate, source, and drain, respectively, and the gate-source voltage, the gate-drain voltage, and the drain-source voltage may become 1.07 V, 1.07 V, and 0 V, respectively, so that the voltages less than 1.32 V may be applied in all cases.

Figure 9:
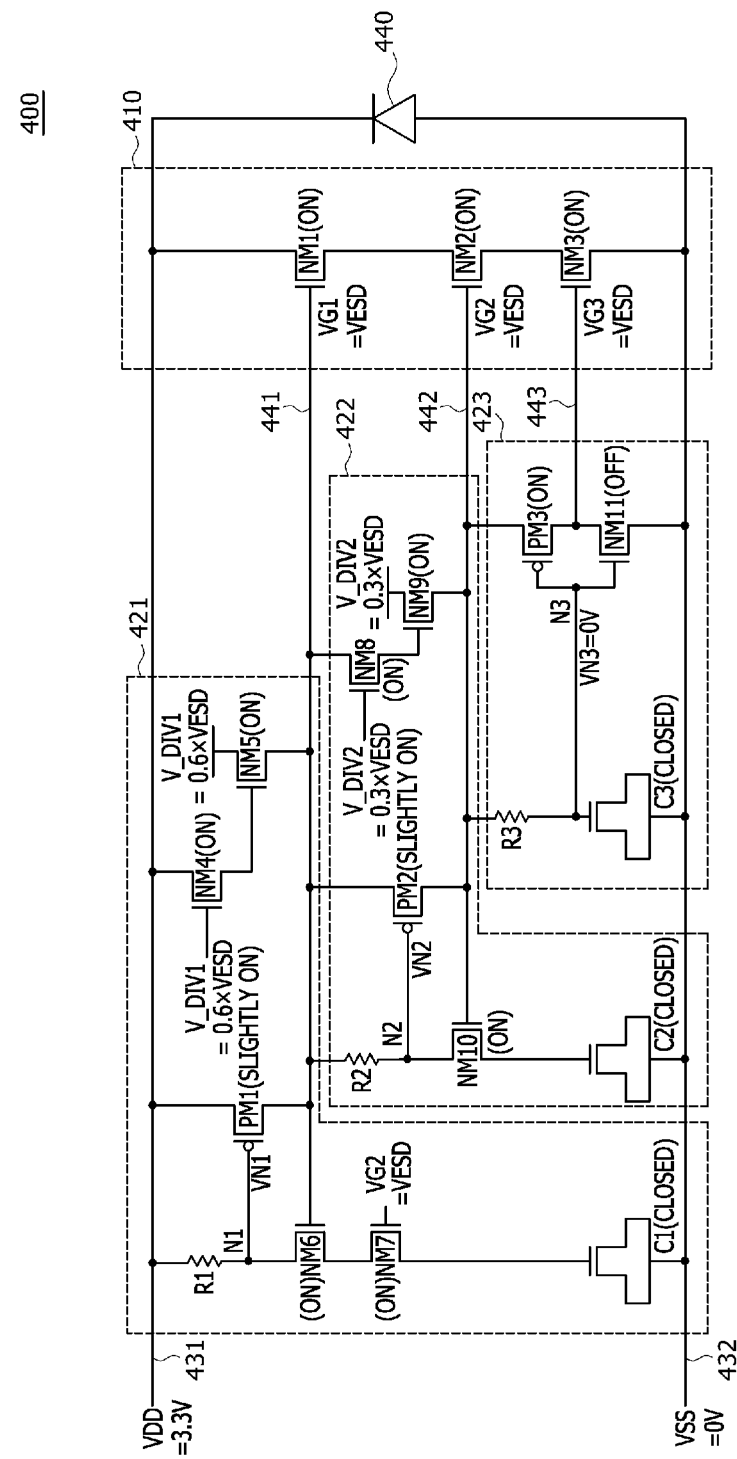
FIG. 9 is a circuit diagram illustrating an example of an electro-static discharge protection operation of a power clamp circuit of FIG. 6 according to other embodiment of the present disclosure.

FIG. 9 is a circuit diagram illustrating an example of an electro-static discharge ESD protection operation of a power clamp circuit of FIG. 6 according to other embodiment of the present disclosure. In an example, an ESD event may occur in an electronic device (100 in FIG. 1) including a power clamp circuit 400 when an ESD surge voltage is applied to a pad (110 in FIG. 1). As described above with reference to FIG. 1, an ESD voltage applied to the pad (110 in FIG. 1) is applied to a first power rail 162 through an upper ESD protection circuit 131. In this example, as in the case of FIG. 8, first to third PMOS transistors PM1-PM3 and first to eleventh NMOS transistors NM1-NM11 constituting the power clamp circuit 400 each with an operating voltage of 1.2 V are described. A voltage branch circuit (500 in FIG. 7) outputs a first branch voltage V_DIV1 of a magnitude corresponding to 60% of an ESD voltage VESD and a second branch voltage V_DIV2 of a magnitude corresponding to 30% of an ESD voltage VESD.

Referring to FIG. 9, when the ESD voltage VESD is applied to a pad 100, a first capacitor C1 of a first triggering circuit 421 may form a closed circuit due to the alternating characteristics of the ESD voltage VESD. The first node voltage VN1, which is less than the ESD voltage VESD, may be applied to a first node N1 of the first triggering circuit 421. The first node voltage VN1 may be applied to the gate of the first PMOS transistor PM1 of the first triggering circuit 421. Because the source of the first PMOS transistor PM1 is coupled to the first power rail 431, the ESD voltage VESD may be applied to the source of the first PMOS transistor PM1. When a difference between the ESD voltage VESD and the first node voltage VN1 becomes greater than the threshold voltage of the first PMOS transistor PM1, the first PMOS transistor PM1 may be turned on. In this case, the first PMOS transistor PM1 might not be fully turned on but may be slightly turned on. As the first PMOS transistor PM1 is turned on, the ESD voltage VESD may be applied to a first gate line 441.

A first branch voltage V_DIV1 output from a voltage branch circuit (500 in FIG. 7) may be applied to the gate of the fourth NMOS transistor NM4 of the first triggering circuit 421. As described above, the first branch voltage V_DIV1 may have a magnitude corresponding to 60% of the ESD voltage VESD (i.e., 0.6×VESD). As the first branch voltage V_DIV1 is applied to the gate of the fourth NMOS transistor NM4, the fourth NMOS transistor NM4 may be turned on. Because the fourth NMOS transistor NM4 acts as a pass transistor, the voltage obtained by subtracting the threshold voltage of the fourth NMOS transistor NM4 from the first branch voltage V_DIV1 may be applied to the source of the fourth NMOS transistor NM4, that is, the gate of the fifth NMOS transistor NM5. Hereinafter, the change in voltage magnitude due to the threshold voltage in each MOS transistor will be ignored. The first branch voltage V_DIV1 may be applied to the gate of the fifth NMOS transistor NM5, but the fifth NMOS transistor NM5 may be turned on as the ESD voltage VESD is applied to the source of the fifth NMOS transistor NM5. When the first PMOS transistor PM1 is turned on, the ESD voltage VESD applied to the first gate line 441 may be applied to the gate of the first NMOS transistor NM1 of an ESD current discharge circuit 410 as the first gate voltage VG1, and thus, the first NMOS transistor NM1 may be turned on. Additionally, the ESD voltage VESD applied to the first gate line 441 may also be applied to the gate of the sixth NMOS transistor NM6, and thus, the sixth NMOS transistor NM6 may also be turned on.

When the ESD voltage VESD is applied to the first gate line 441, a second capacitor C2 of a second triggering circuit 422 may also form a closed circuit like the first capacitor C1. A second node voltage VN2, which is less than the ESD voltage VESD applied to the first gate line 441, may be applied to a second node N2 of the second triggering circuit 422. The second node voltage VN2 may be applied to the gate of the second PMOS transistor PM2 of the second triggering circuit 422. Because the source of the second PMOS transistor PM2 is coupled to the first gate line 441, the ESD voltage VESD may be applied to the source of the second PMOS transistor PM2. When a difference between the ESD voltage VESD and the second node voltage VN2 becomes greater than the threshold voltage of the second PMOS transistor PM2, the second PMOS transistor PM2 may be turned on. In this case, the second PMOS transistor PM2 may be in a slightly turned-on state, like the first PMOS transistor PM1. As the second PMOS transistor PM2 is turned on, the ESD voltage VESD may be applied to the second gate line 442.

A second branch voltage V_DIV2 output from a voltage branch circuit (500 in FIG. 7) may be applied to the gate of the eighth NMOS transistor NM8 of the second triggering circuit 422. As described above, the second branch voltage V_DIV2 may have a magnitude corresponding to 30% of the ESD voltage VESD (i.e., 0.3×VESD). As the second branch voltage V_DIV2 is applied to the gate of the eighth NMOS transistor NM8 of the second triggering circuit 422, the eighth NMOS transistor NM8 may be turned on. As the eighth NMOS transistor NM8 is turned on, the ninth NMOS transistor NM9 may also be turned on.

The ESD voltage VESD applied to the second gate line 442 may be applied to the gate of the second NMOS transistor NM2 of the ESD current discharge circuit 410 as the second gate voltage VG2, and thus, the second NMOS transistor NM2 may be turned on. Because the ESD voltage VESD applied to the second gate line 442 is also applied to the gate of the tenth NMOS transistor NM10, the tenth NMOS transistor NM10 may also be turned on. As the tenth NMOS transistor NM10 is turned on, the state of the second PMOS transistor PM2 may be changed from the slightly turned-on state to a fully turned-on state. The ESD voltage VESD applied to the second gate line 442 may also be applied to the gate of the seventh NMOS transistor NM7 of the first triggering circuit 421, and thus, the seventh NMOS transistor NM7 may be turned on. As the seventh NMOS transistor NM7 is turned on, the state of first PMOS transistor PM1 may also be changed from the slightly turned-on state to the fully turned-on state.

When the ESD voltage VESD is applied to the second gate line 442, a third capacitor C3 of a third triggering circuit 423 may also form a closed circuit like the first capacitor C1 and the second capacitor C2. A third node voltage VN3, which is a ground voltage of 0 V, may be applied to a third node N3 of the third triggering circuit 423. The voltage of 0 V, which is the third node voltage VN3, may be an input voltage of an inverter circuit constituted with the third PMOS transistor PM3 and the eleventh NMOS transistor NM11. As the third PMOS transistor PM3 is turned on and the eleventh NMOS transistor NM11 is turned off, the ESD voltage VESD may be applied to a third gate line 443. Accordingly, the ESD voltage VESD may be applied to the gate of the third NMOS transistor NM3 of the ESD current discharge circuit 410 as a third gate voltage VG3, and the third NMOS transistor NM3 may be turned on. When the first NMOS transistor NM1, the second NMOS transistor NM2, and the third NMOS transistor NM3 of the ESD current discharge circuit 410 are all turned on, the ESD current may be discharged from the first power rail 431 to the second power rail 432 through the first NMOS transistor NM1, the second NMOS transistor NM2, and the third NMOS transistor NM3. The turned-on states of the first NMOS transistor NM1, the second NMOS transistor NM2, and the third NMOS transistor NM3 of the ESD current discharge circuit 410 may be maintained for a time interval corresponding to a first RC delay time from the first resistor R1 and the first capacitor C1 of the first triggering circuit 421 (same as the second RC delay time from the second resistor R2 and the second capacitor C2 of the second triggering circuit 422, and the third RC delay time from the third resistor R3 and the third capacitor C3 of the third triggering circuit 422).

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A power clamp circuit comprising:

an electro-static discharge (ESD) current discharge circuit including a first MOS transistor, a second MOS transistor, and a third MOS transistor that are coupled in series between a first power rail coupled to a supply voltage and a second power rail coupled to a ground voltage;

a voltage branch circuit configured to provide a first branch voltage and a second branch voltage, a first triggering circuit including a first resistor, a first capacitor, and a fourth MOS transistor and configured to trigger the first MOS transistor;

a second triggering circuit including a second resistor, a second capacitor, and a fifth MOS transistor and configured to trigger the second MOS transistor; and a third triggering circuit including a third resistor and a third capacitor, and configured to turn off the third MOS transistor during a normal operation and to turn on the third MOS transistor when an ESD event occurs, wherein the first triggering circuit is configured to provide the first branch voltage generated by the voltage branch circuit to a gate of the first MOS transistor, wherein the second triggering circuit is configured to provide the second branch voltage generated by the voltage branch circuit to a gate of the second MOS transistor, and wherein the voltage branch circuit is configured to provide the first branch voltage of at least 60% of a voltage applied to the first power rail, and to provide the second branch voltage of at least 30% of a voltage applied to the first power rail.

2. The power clamp circuit of claim 1, wherein the first MOS transistor, the second MOS transistor, and the third MOS transistor are a first N-channel type MOS (NMOS) transistor, a second NMOS transistor, and a third NMOS transistor, respectively, wherein a gate of the first NMOS transistor is coupled to a first gate line, a drain of the first NMOS transistor is coupled to the first power rail, and a source of the first NMOS transistor is coupled to a drain of the second NMOS transistor, wherein a gate of the second NMOS transistor is coupled to a second gate line, and a source of the second NMOS transistor is coupled to a drain of the third NMOS transistor, and wherein a gate of the third NMOS transistor is coupled to a third gate line, and a source of the third NMOS transistor is coupled to the second power rail.

3. The power clamp circuit of claim 2, wherein the first triggering circuit is configured to provide an ESD voltage to the first gate line when the ESD event occurs, and wherein the second triggering circuit is configured to:

provide an ESD voltage to the second gate line when the ESD event occurs.

4. The power clamp circuit of claim 3 wherein the voltage branch circuit includes a plurality of diode-connected MOS transistors coupled in series between the first power rail and the second power rail.

5. The power clamp circuit of claim 3, wherein the first resistor is disposed between the first power rail and a first node, the first capacitor is disposed between the first node and the second power rail, and the fourth MOS transistor is a first P-channel type (PMOS) transistor, and wherein a gate of the first PMOS transistor is coupled to the first node, a source of the first PMOS transistor is coupled to the first power rail, and a drain of the first PMOS transistor is coupled to the first gate line.

6. The power clamp circuit of claim 3, wherein the first triggering circuit further includes a sixth MOS transistor and a seventh MOS transistor that are disposed between the first power rail and the first gate line, and the sixth MOS transistor and the seventh MOS transistor are a fourth NMOS transistor and a fifth NMOS transistor, respectively, wherein a gate of the fourth NMOS transistor is coupled to the first branch voltage, a drain of the fourth NMOS transistor is coupled to the first power rail, and a source of the fourth NMOS transistor is coupled to a gate of the fifth NMOS transistor, and wherein a drain of the fifth NMOS transistor is coupled to the first branch voltage, and a source of the fifth NMOS transistor is coupled to the first gate line.

7. The power clamp circuit of claim 3, wherein the first triggering circuit further includes an eighth MOS transistor and a ninth MOS transistor that are disposed between a first node and the first capacitor, and the eighth MOS transistor and the ninth MOS transistor are a sixth NMOS transistor and a seventh NMOS transistor, respectively, wherein a gate of the sixth NMOS transistor is coupled to the first gate line, a drain of the sixth NMOS transistor is coupled to the first node, and a source of the sixth NMOS transistor is coupled to a drain of the seventh NMOS transistor, and wherein a gate of the seventh NMOS transistor is coupled to the second gate line, and a source of the seventh NMOS transistor is coupled to the first capacitor.

8. The power clamp circuit of claim 3, wherein the second resistor is disposed between the first gate line and a second node, the second capacitor is disposed between the second node and the second power rail, and the fifth MOS transistor is a second PMOS transistor, and wherein a gate of the second PMOS transistor is coupled to the second node, a source of the second PMOS transistor is coupled to the first gate line, and a drain of the second PMOS transistor is coupled to the second gate line.

9. The power clamp circuit of claim 8, wherein the second triggering circuit further includes a tenth MOS transistor and an eleventh MOS transistor that are disposed between the first gate line and the second gate line, and the tenth MOS transistor and the eleventh MOS transistor are an eighth NMOS transistor and a ninth NMOS transistor, respectively, wherein a gate of the eighth NMOS transistor is coupled to the second branch voltage, a drain of the eighth NMOS transistor is coupled to the first gate line, and a source of the eighth NMOS transistor is coupled to a gate of the ninth NMOS transistor, and wherein a drain of the ninth NMOS transistor is coupled to the second branch voltage, and a source of the ninth NMOS transistor is coupled to the second gate line.

10. The power clamp circuit of claim 9, wherein the second triggering circuit further includes a twelfth MOS transistor disposed between the second node and the second capacitor, and the twelfth MOS transistor is a tenth NMOS transistor, and wherein a gate of the tenth NMOS transistor is coupled to the second gate line, a drain of the tenth NMOS transistor is coupled to the second node, and a source of the tenth NMOS transistor is coupled to the second capacitor.

11. The power clamp circuit of claim 3, wherein the third triggering circuit is configured to:

provide the ground voltage to the third gate line, and provide an ESD voltage to the third gate line when the ESD event occurs.

12. The power clamp circuit of claim 3, wherein the third resistor is disposed between the third gate line and a third node, the third capacitor is disposed between the third node and the second power rail, and an inverter circuit includes a third P-channel type (PMOS) transistor and an eleventh NMOS transistor, wherein a gate of the third PMOS transistor and a gate of the eleventh NMOS transistor are commonly coupled to the third node, a source of the third PMOS transistor is coupled to the second gate line, and a drain of the third PMOS transistor and a drain of the eleventh NMOS transistor are commonly coupled to the third gate line, and wherein a source of the eleventh NMOS transistor is coupled to the second power rail.

13. The power clamp circuit of claim 1, wherein a product of a resistance of the first resistor and a capacitance of the first capacitor is equal to a product of a resistance of the second resistor and a capacitance of the second capacitor and a product of a resistance of the third resistor and a capacitance of the third capacitor.

14. An electronic device comprising:

a pad;

an internal circuit coupled to the pad, a first power rail through which a supply voltage is provided, and a second power rail through which a ground voltage is provided; and a power clamp circuit configured to protect the internal circuit when an electro-static discharge (ESD) event occurs, wherein the power clamp circuit includes:

an ESD current discharge circuit including a first MOS transistor, a second MOS transistor, and a third MOS transistor that are coupled in series between the first power rail and the second power rail;

a voltage branch circuit configured to provide a first branch voltage and a second branch voltage, a first triggering circuit including a first resistor, a first capacitor, and a fourth MOS transistor and configured to trigger the first MOS transistor;

a second triggering circuit including a second resistor, a second capacitor, and a fifth MOS transistor and configured to trigger the second MOS transistor; and a third triggering circuit including a third resistor and a third capacitor, and configured to turn off the third MOS transistor during a normal operation and to turn on the third MOS transistor when the ESD event occurs, wherein the first triggering circuit is configured to provide the first branch voltage generated by the voltage branch circuit to a gate of the first MOS transistor, wherein the second triggering circuit is configured to provide the second branch voltage generated by the voltage branch circuit to a gate of the second MOS transistor, and wherein the voltage branch circuit is configured to provide the first branch voltage of at least 60% of a voltage applied to the first power rail, and to provide the second branch voltage of at least 30% of a voltage applied to the first power rail.

15. The electronic device of claim 14, wherein the first MOS transistor, the second MOS transistor, and the third MOS transistor are a first N-channel type MOS (NMOS) transistor, a second NMOS transistor, and a third NMOS transistor, respectively, wherein a gate of the first NMOS transistor is coupled to a first gate line, a drain of the first NMOS transistor is coupled to the first power rail, and a source of the first NMOS transistor is coupled to a drain of the second NMOS transistor, wherein a gate of the second NMOS transistor is coupled to a second gate line, and a source of the second NMOS transistor is coupled to a drain of the third NMOS transistor, and wherein a gate of the third NMOS transistor is coupled to a third gate line, and a source of the third NMOS transistor is coupled to the second power rail.

16. The electronic device of claim 15, wherein the first triggering circuit is configured to provide an ESD voltage to the first gate line when the ESD event occurs, wherein the second triggering circuit is configured to provide an ESD voltage to the second gate line when the ESD event occurs, and wherein the third triggering circuit is configured to provide the ground voltage, and provide an ESD voltage to the third gate line when the ESD event occurs.

17. The electronic device of claim 16, wherein the first triggering circuit further includes a sixth MOS transistor, a seventh MOS transistor, an eighth MOS transistor, and a ninth MOS transistor, wherein the fourth MOS transistor, the sixth MOS transistor, the seventh MOS transistor, the eighth MOS transistor, and the ninth MOS transistor are a first P-channel type MOS (PMOS) transistor, a fourth NMOS transistor, a fifth NMOS transistor, a sixth NMOS transistor, and a seventh NMOS transistor, respectively, wherein the first resistor is coupled to the first power rail and a first node, wherein gate, source, and drain of the first PMOS transistor are coupled to the first node, the first power rail, and the first gate line, respectively, wherein gate, drain, and source of the fourth NMOS transistor are coupled to the first branch voltage generated by branching the supply voltage, the first power rail, and a gate of the fifth NMOS transistor, respectively, wherein drain and source of the fifth NMOS transistor are coupled to the first branch voltage and the first gate line, respectively, wherein gate, drain, and source of the sixth NMOS transistor are coupled to the first gate line, the first node, and a drain of the seventh NMOS transistor, respectively, and wherein gate and source of the seventh NMOS transistor are coupled to the second gate line and the first capacitor, respectively.

18. The electronic device of claim 17, wherein the second triggering circuit further includes a tenth MOS transistor, an eleventh MOS transistor, and a twelfth MOS transistor, wherein the fifth MOS transistor, the tenth MOS transistor, the eleventh MOS transistor, and the twelfth MOS transistor are a second PMOS transistor, an eighth NMOS transistor, a ninth NMOS transistor, and a tenth NMOS transistor, respectively, wherein the second resistor is coupled to the first gate line and a second node, wherein gate, source, and drain of the second PMOS transistor are coupled to the second node, the first gate line, and the second gate line, respectively, wherein gate, drain, and source of the eighth NMOS transistor are coupled to the second branch voltage, the first gate line, and a gate of the ninth NMOS transistor, respectively, wherein drain and source of the ninth NMOS transistor are coupled to the second branch voltage and the second gate line, respectively, and wherein gate, drain, and source of the tenth NMOS transistor are coupled to the second gate line, the second node, and the second capacitor, respectively.

19. The electronic device of claim 18, wherein the third resistor is disposed between the third gate line and a third node, the third capacitor is disposed between the third node and the second power rail, and an inverter circuit includes a third P-channel type (PMOS) transistor and an eleventh NMOS transistor, wherein a gate of the third PMOS transistor and a gate of the eleventh NMOS transistor are commonly coupled to the third node, a source of the third PMOS transistor is coupled to the second gate line, and a drain of the third PMOS transistor and a drain of the eleventh NMOS transistor are commonly coupled to the third gate line, and wherein a source of the eleventh NMOS transistor is coupled to the second power rail.

* * * * *